US010622043B2

(12) United States Patent
Nguyen et al.

(10) Patent No.: US 10,622,043 B2
(45) Date of Patent: Apr. 14, 2020

(54) MULTI-PUMP MEMORY SYSTEM ACCESS CIRCUITS FOR SEQUENTIALLY EXECUTING PARALLEL MEMORY OPERATIONS

(71) Applicant: QUALCOMM Incorporated, San Diego, CA (US)

(72) Inventors: Hoan Huu Nguyen, Cary, NC (US); Jihoon Jeong, Cary, NC (US); Francois Ibrahim Atallah, Raleigh, NC (US); Keith Alan Bowman, Morrisville, NC (US)

(73) Assignee: Qualcomm Incorporated, San Diego, CA (US)

( * ) Notice: Subject to any disclaimer, the term of this patent is extended or adjusted under 35 U.S.C. 154(b) by 33 days.

(21) Appl. No.: 16/126,817

(22) Filed: Sep. 10, 2018

(65) Prior Publication Data
US 2019/0080737 A1  Mar. 14, 2019

Related U.S. Application Data

(60) Provisional application No. 62/556,949, filed on Sep. 11, 2017.

(51) Int. Cl.
*G11C 8/00* (2006.01)
*G11C 8/16* (2006.01)
(Continued)

(52) U.S. Cl.
CPC ............ *G11C 8/16* (2013.01); *G06F 13/1684* (2013.01); *G11C 7/1075* (2013.01); *G11C 8/04* (2013.01);
(Continued)

(58) Field of Classification Search
CPC .......... G11C 8/16; G11C 7/1075; G11C 8/04; G11C 8/08; G06F 13/1684
(Continued)

(56) References Cited

U.S. PATENT DOCUMENTS

2002/0120798 A1* 8/2002 Modelski .......... H04L 12/40006
710/107
2006/0171239 A1   8/2006 Balasubramanian et al.
(Continued)

FOREIGN PATENT DOCUMENTS

EP         2571027 A1    3/2013

OTHER PUBLICATIONS

Ditlow, Gary S. et al., "A 4R2W Register File for a 2.3GHz Wire-Speed POWER™ Processor with Double-Pumped Write Operation," 2011 IEEE International Solid-State Circuits Conference, ISSCC 2011, Session 14, High-Performance Embedded Memory, 2011, pp. 256-257.
(Continued)

*Primary Examiner* — Vu A Le
(74) *Attorney, Agent, or Firm* — Withrow & Terranova, PLLC

(57) ABSTRACT

Multi-pump memory system access circuits for sequentially executing parallel memory operations in a memory system are disclosed. A memory system includes a plurality of memory bit cells in a memory array. Each memory bit cell is accessible at a corresponding memory address used by memory read and write operations. The memory system includes ports at which a memory read or a memory write operation is received from a processor in each cycle of a processor clock. To increase memory bandwidth of the memory system without increasing the number of access ports of the memory array within the memory system, a double-pump memory system access circuit double-pumps
(Continued)

(i.e., time-multiplexes) the access ports of memory array, effectively doubling the number of ports of the memory array. The double-pump memory system access circuit performs sequential accesses to a port of a memory cell in a memory array within a processor clock period.

27 Claims, 28 Drawing Sheets

(51) Int. Cl.
  *G11C 7/10* (2006.01)
  *G06F 13/16* (2006.01)
  *G11C 8/04* (2006.01)
  *G11C 8/08* (2006.01)
  *G11C 11/419* (2006.01)
  *G11C 8/10* (2006.01)
  *G11C 8/18* (2006.01)

(52) U.S. Cl.
  CPC ............... *G11C 8/08* (2013.01); *G11C 8/10* (2013.01); *G11C 8/18* (2013.01); *G11C 11/419* (2013.01); *G11C 2207/2209* (2013.01)

(58) Field of Classification Search
  USPC .................................................. 365/230.05
  See application file for complete search history.

(56) References Cited

U.S. PATENT DOCUMENTS

| | | | |
|---|---|---|---|
| 2008/0181040 A1 | 7/2008 | Huang et al. | |
| 2008/0239842 A1* | 10/2008 | Cha ..................... | G11C 8/18 365/193 |
| 2011/0292748 A1* | 12/2011 | Adams ............... | G06F 17/5045 365/203 |

OTHER PUBLICATIONS

International Search Report and Written Opinion for International Patent Application No. PCT/US2018/050347, dated Jan. 3, 2019, 13 pages.

\* cited by examiner

MULTI-PUMP MEMORY SYSTEM ACCESS CIRCUITS FOR SEQUENTIALLY EXECUTING PARALLEL MEMORY OPERATIONS

PRIORITY APPLICATION

The present application claims priority under 35 U.S.C. § 119(e) to U.S. Provisional Patent Application Ser. No. 62/556,949, filed Sep. 11, 2017 and entitled "DOUBLE-PUMP READ CIRCUITS CONFIGURED TO ENABLE MULTIPLE READ OPERATIONS OF A MEMORY ARRAY IN A SINGLE CLOCK CYCLE," which is incorporated herein by reference in its entirety.

BACKGROUND

I. Field of the Disclosure

The technology of the disclosure relates generally to memory systems and, in particular, to memory access bandwidth for memory access requests to memory arrays in memory systems.

II. Background

Users of electronic devices have become accustomed to nearly instantaneous responses for many tasks. Fast response times of electronic devices are possible because computer processors are designed to execute sets of instructions quickly. The circuits of a computer processor operate using a periodic clock, so the speed of the processor depends on the clock period and on the processor's ability to execute instructions in as few clock periods as possible. To efficiently execute instructions, the processor needs instructions and data to be available when the processor is ready for them. Otherwise, clock cycles are wasted as the processor waits. The instructions themselves, and data used in the instructions, are read from a memory array in a memory system, and the data resulting from the instruction execution is written to a memory to be stored. If there is a delay in reading instructions or data from a memory, the processor efficiency decreases. Similarly, if the processor cannot store resultant data as quickly as the data is produced, the processor may need to temporarily suspend execution of instructions, which decreases processor efficiency. Therefore, the ability of a processor to operate efficiently, so a device can respond quickly, depends on the speed with which data can be read from and written to a memory system.

For example, high-powered computers, such as machine learning processors, may contain a large number (e.g., thousands) of multiply-accumulate (MAC) processing units executing in parallel. Thus, many MAC processing units may work together in parallel to execute instructions for completing a particular task. As a result, several processors may access the instructions and data in the same memory system. It is common in such processors for multiple MAC processing units to request (i.e., READ) instructions and/or data from the same memory, at the same or a different memory location, on the same cycle. It is also possible for multiple processors to store (i.e., WRITE) resultant data to the memory system on the same cycle. In this regard, memory systems have been designed with multiple read ports and multiple write ports to allow the memory system to handle multiple READ requests or multiple WRITE requests in parallel in the same processor cycle. However, each read port and write port requires a dedicated set of circuits for accessing the memory system. For example, each memory operation has a corresponding memory address, and each memory address may be different. Thus, to read multiple addresses in parallel, a separate decoder circuit is needed for decoding each of the multiple addresses in the same processor clock cycle. In addition, separate data paths and control circuits are used to move data between memory arrays in a memory system and respective parallel ports. Additional circuits needed for additional ports can significantly increase the space required for the memory array on a chip and the power consumed by the memory array. The additional control circuits also increase the latency of a memory access.

The memory bandwidth between a processor and a memory array is the quantity of data that can be read from or written to the memory array in a processor in a given time period, such as a clock period of the processor. The memory bandwidth is determined by several factors, including the number of memory array read and write ports that can be simultaneously accessed in a processor clock period, the width of the read and write ports the amount of data transferred through a port at a time), and the period of the processor clock cycle. A higher bandwidth memory array with low latency would be beneficial for reducing processor inefficiency, and therefore reducing the processing time required to perform a task. Additionally, it would be beneficial if the higher bandwidth memory could be attained without significantly increasing the number of circuits in the memory array.

SUMMARY OF THE DISCLOSURE

Aspects disclosed herein include multi-pump memory system access circuits for sequentially executing parallel memory operations in a memory system. In one example, the multi-pump memory system access circuits may be double-pump memory system access circuits ("DP memory system access circuits") sequentially executing two memory operations received in parallel. A memory system includes a memory array or a register file that contains a plurality of memory bit cells configured to store data (e.g., a logical "0" or "1"). In exemplary aspects disclosed herein, the memory system includes access ports at which memory read operations and memory write operations may be received from a processor or memory controller. A memory read operation may be received at a read port and a memory write operation may be received at a memory write port in each cycle of a clock. The clock may be used to synchronize the memory operations with external circuits. To execute the received memory operations in parallel by the memory system, the memory arrays and the memory bit cells therein may have a same number of access ports as the memory system. To increase memory bandwidth, a number of access ports of the memory system may be increased to increase a number of memory operations that can be executed in parallel in each clock cycle. However, increasing a number of memory ports in the memory arrays requires a significant increase in circuitry. To increase a number of memory system access ports without also requiring an increase in memory array ports, a multi-pump memory system access circuit is configured to multi-pump (i.e., time-multiplex) the access ports of the memory array. A multi-pump memory system access circuit receives multiple operations in parallel on multiple ports of a memory system, and sequentially executes the multiple operations in an overlapping manner. By partially overlapping the sequential execution of the memory access operations received in parallel, the memory access operations are executed in less time than is required to execute a same number of memory array access operations sequentially over a single access port.

In a multi-pump read example, multiple read ports receive read requests in parallel. Memory addresses associated with the read requests are decoded in parallel and provided to an array controller to sequentially execute the read requests in the memory array. Each read port receives data from the memory array on a dedicated global read bit line. Each global read bit line is charged to a data value of a memory bit cell corresponding to a memory read operation received on the port. To avoid suspending a second sequential read operation from being executed in the memory array while a first global read bit line is being charged by the memory array in response to a first read operation, the first read data from the first read operation array is directed to a data latch. The first global read bit line is charged to the first data value by the data latch while a second read operation is sequentially commenced in the memory array. Second read data of the second read operation may be charged onto the second global read bit line by the memory array. In one example, the first and second read operations may be received in parallel in a same clock cycle, and the first read data is provided to the first read port in a same clock cycle as the second read data is provided to the second read port.

In a multi-pump write circuit, multiple write ports receive write requests in parallel. The write operations are sequentially executed in an overlapping manner such that a time for executing a number of write operations received in parallel is less than the time for executing a same number of write operations received sequentially on a single port. In an example, a first write data and a second write data corresponding to first and second write operations may he received in parallel in a multi-port latch circuit. The multi-port latch circuit may be coupled to a global write bit line that is also coupled to a memory array. By employing a clock generation circuit to control timing of the multi-port latch and the sequential write operations, the multi-port latch may sequentially provide first write data and second write data, received in parallel, to the global write bit line for storage in the memory array. The multi-port latch avoids a multiplexer delay associated with receiving the first and second write data in separate latches, and the multi-pump write circuit executes the first and second write operations received in parallel in less time than is required to execute two sequential write operations on a single write port. In one example, a first write data of a first write operation may be received in parallel to a second write data of a second write operation in a same cycle, and the first write data and the second write data may he written to a memory array in a same cycle.

In this regard, in one exemplary aspect, a double-pump read circuit is provided. The double-pump read circuit comprises a decoder control circuit configured to receive a first memory read request in parallel with a second memory read request. The decoder control circuit comprises a first decoder circuit configured to generate a first decoded read address corresponding to the first memory read request, and a second. decoder circuit configured to generate a second decoded read address corresponding to the second memory read request. The double-pump read circuit comprises an array control circuit configured to activate a first read word line corresponding to the first decoded read address corresponding to a first memory bit cell among a plurality of memory bit cells in a memory array, and activate a second read word line corresponding to the second decoded read address corresponding to a second memory bit cell among the plurality of memory bit cells in the memory array. The double-pump read circuit comprises a read bit line circuit configured to, responsive to the first read word line being activated, set a local read bit line to a first data value of first data stored in the first memory bit cell corresponding to the first decoded read address, and set an intermediate value on an intermediate read bit line according to the first data value, and responsive to the second read word line being activated, set the local read bit line to a second data value of second data stored in the second memory bit cell corresponding to the second decoded read address, and set the intermediate value on the intermediate read bit line according to the second data value. The double-pump read circuit comprises a latch configured to store the intermediate value on the intermediate read bit line. The double-pump read circuit comprises an evaluation circuit. The evaluation circuit is configured to couple a data output of the latch to a first global read bit line to set a first read data value of the first global read bit line to the stored intermediate value, evaluate the first global read bit line, couple the intermediate read bit line to a second global read bit line to set a second read data value of the second global read bit line to the intermediate value, and evaluate the second global read bit line.

In another exemplary aspect, a method of double-pumping read requests in a memory system is provided. The method comprises receiving a first memory read request in parallel with a second memory read request. The method comprises generating a first decoded read address corresponding to the first memory read request and generating a second decoded read address corresponding to the second memory read request. The method also comprises activating a first read word line corresponding to the first decoded read address corresponding to a first memory bit cell among a plurality of memory bit cells in a memory array. The method also comprises activating a second read word line corresponding to the second decoded read address corresponding to a second memory bit cell among the plurality of memory bit cells in the memory array. The method also comprises, responsive to the first read word line being activated, setting a local read bit line to a first data value of first data stored in the first memory bit cell corresponding to the first decoded read address, and setting an intermediate value on an intermediate read bit line according to the first data value. The method also comprises, responsive to the second read word line being activated, setting the local read bit line to a second data value of second data stored in the second memory bit cell corresponding to the second decoded read address, and setting the intermediate value on the intermediate read bit line according to the second data value. The method also comprises storing the intermediate value on the intermediate read bit line in a latch. The method also comprises coupling a data output of the latch to a first global read bit line to set a first read data value of the first global read bit line to the stored intermediate value. The method also comprises evaluating the first read data value on the first global read bit line. The method also comprises coupling the intermediate read bit line to a second global read bit line to set a second read data value of the second global read bit line to the intermediate value. The method also comprises evaluating the second read data value on the second global read bit line.

In another exemplary aspect, a double-pump write circuit is provided. The double-pump write circuit comprises a decoder control circuit configured to receive a first memory write request in parallel with a second memory write request. The decoder control circuit comprises a first decoder circuit configured to generate a first decoded write address corresponding to the first memory write request, and a second decoder circuit configured to generate a second decoded write address corresponding to the second memory write request. The double-pump write circuit comprises an array control circuit configured to activate a first write word line corresponding to the first decoded write address corresponding to a first memory bit cell among a plurality of memory bit cells in a memory array, and activate a second write word line corresponding to the second decoded write address corresponding to a second memory bit cell among the plurality of memory bit cells in the memory array. The double-pump write circuit comprises a latch circuit comprising a first staging latch, a second staging latch, and a write latch. The latch circuit is configured to receive, in parallel, first write data corresponding to the first memory write request at the first staging latch, and second write data corresponding to the second memory write request at the second staging latch, and sequentially transfer the first write data of the first staging latch to the write latch, and transfer the second write data of the second staging latch to the write latch. The double-pump write circuit comprises a global write bit line coupled to a data output of the write latch, to set a global write data value to a write data value of the data output of the write latch. The double-pump write circuit comprises a local write bit line circuit configured to couple the global write bit line to a local write bit line to set a local write data value on the local write bit line to the global write data value on the global write bit line, responsive to the first write word line being activated, store the local write data value of the local write bit line in the first memory bit cell, and responsive to the second write word line being activated, store the local write data value of the local write bit line in the second memory bit cell.

In another exemplary aspect, a method of double-pumping write requests in a memory system is provided. The method comprises receiving a first memory write request in parallel with a second memory write request. The method also comprises generating a first decoded write address corresponding to the first memory write request and generating a second decoded write address corresponding to the second memory write request. The method also comprises activating a first write word line corresponding to the first decoded write address corresponding to a first memory bit cell among a plurality of memory bit cells in a memory array. The method also comprises activating a second write word line corresponding to the second decoded write address corresponding to a second memory bit cell among the plurality of memory bit cells in the memory array. The method also comprises receiving, in parallel, first write data corresponding to the first memory write request at a first staging latch, and second write data corresponding to the second memory write request at a second staging latch. The method also comprises sequentially transferring the first write data of the first staging latch to a write latch, and transferring the second write data of the second staging latch to the write latch. The method also comprises coupling a data output of the write latch to a global write bit line, the global write bit line having a line value corresponding to a data value of data in the write latch. The method also comprises coupling the global write bit line to a local write bit line. The method also comprises responsive to the first write word line being activated, storing the line value of the local write bit line in the first memory bit cell. The method also comprises, responsive to the second write word line being activated, storing the line value of the local write bit line in the second memory bit cell.

DETAILED DESCRIPTION

Figure 1:
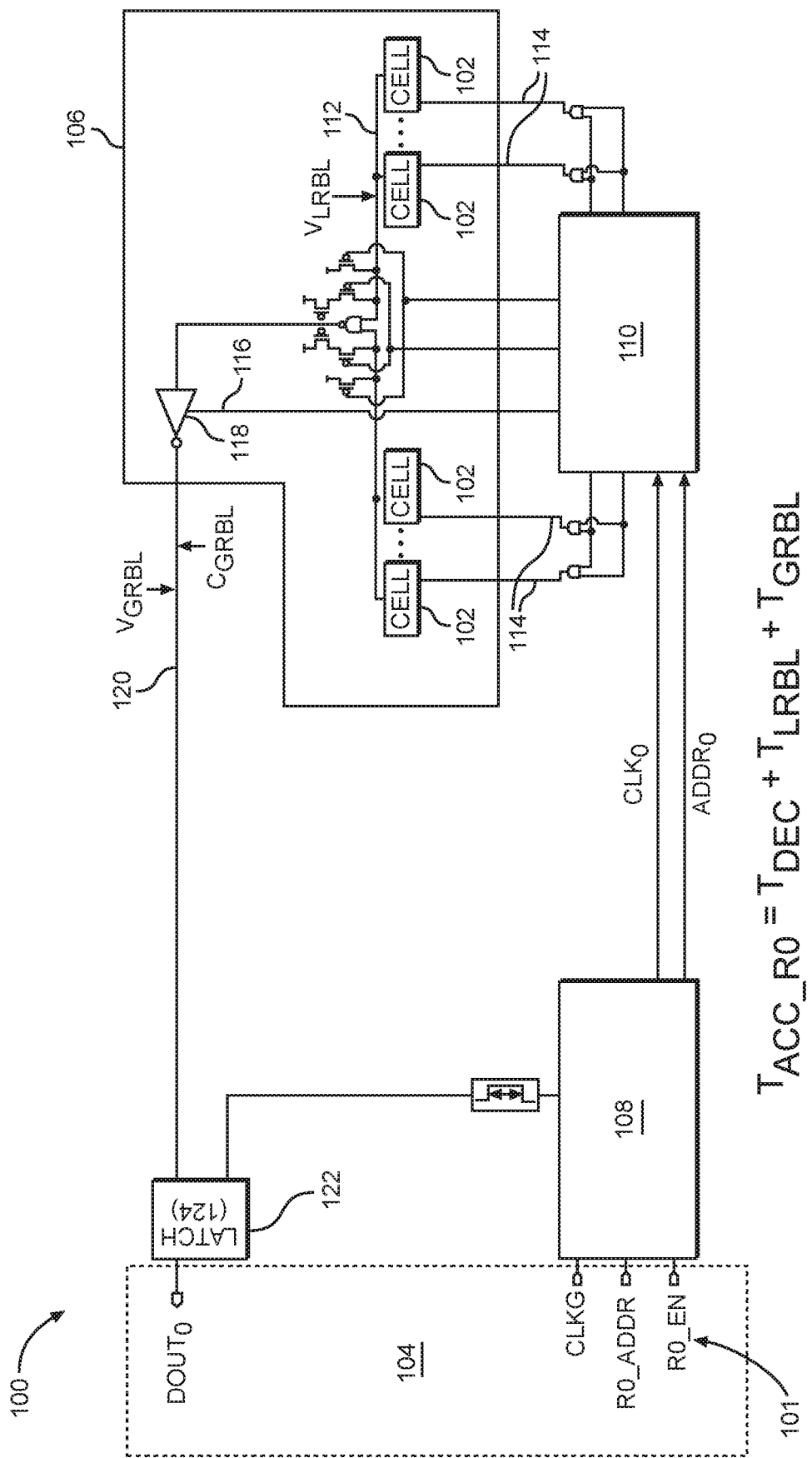
FIG. 1 is a schematic diagram of a conventional read circuit for performing a read operation to a memory bit cell through a read port of a memory array in a memory system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-pump memory system access circuits for sequentially executing parallel memory operations in a memory system. In one example, the multi-pump memory system access circuits may be double-pump memory system access circuits ("DP memory system access circuits") sequentially executing two memory operations received in parallel. A memory system includes a memory array or a register file that contains a plurality of memory bit cells configured to store data (e.g., a logical "0" or "1"). In exemplary aspects disclosed herein, the memory system includes access ports at which memory read operations and memory write operations may be received from a processor or memory controller. A memory read operation may be received at a read port and a memory write operation may be received at a memory write port in each cycle of a clock. The clock may be used to synchronize the memory operations with external circuits. To execute the received memory operations in parallel by the memory system, the memory arrays and the memory bit cells therein may have a same number of access ports as the memory system. To increase memory bandwidth, a number of access ports of the memory system may be increased to increase a number of memory operations that can be executed in parallel in each clock cycle. However, increasing a number of memory ports in the memory arrays requires a significant increase in circuitry. To increase a number of memory system access ports without also requiring an increase in memory array ports, a multi-pump memory system access circuit is configured to multi-pump (i.e., time-multiplex) the access ports of the memory array. A multi-pump memory system access circuit receives multiple operations in parallel on multiple ports of a memory system, and sequentially executes the multiple operations in an overlapping manner. By partially overlapping the sequential execution of the memory access operations received in parallel, the memory access operations are executed in less time than is required to execute a same number of memory array access operations sequentially over a single access port.

In a multi-pump read example, multiple read ports receive read requests in parallel. Memory addresses associated with the read requests are decoded in parallel and provided to an array controller to sequentially execute the read requests in the memory array. Each read port receives data from the memory array on a dedicated global read bit line. Each global read bit line is charged to a data value of a memory bit cell corresponding to a memory read operation received on the port. To avoid suspending a second sequential read operation from being executed in the memory array while a first global read bit line is being charged by the memory array in response to a first read operation, the first read data from the first read operation array is directed to a data latch. The first global read bit line is charged to the first data value by the data latch while a second read operation is sequentially commenced in the memory array. Second read data of the second read operation may be charged onto the second global read bit line by the memory array. In one example, the first and second read operations may be received in parallel in a same clock cycle, and the first read data is provided to the first read port in a same clock cycle as the second read data is provided to the second read port.

In a multi-pump write circuit, multiple write ports receive write requests in parallel. The write operations are sequentially executed in an overlapping manner such that a time for executing a number of write operations received in parallel is less than the time for executing a same number of write operations received sequentially on a single port. In an example, a first write data and a second write data corresponding to first and second write operations may be received in parallel in a multi-port latch circuit. The multi-port latch circuit may be coupled to a global write bit line that is also coupled to a memory array. By employing a clock generation circuit to control timing of the multi-port latch and the sequential write operations, the multi-port latch may sequentially provide first write data and second write data, received in parallel, to the global write bit line for storage in the memory array. The multi-port latch avoids a multiplexer delay associated with receiving the first and second write data in separate latches, and the multi-pump write circuit executes the first and second write operations received in parallel in less time than is required to execute two sequential write operations on a single write port. In one example, a first write data of a first write operation may be received in parallel to a second write data of a second write operation in a same cycle, and the first write data and the second write data may be written to a memory array in a same cycle.

Figure 2:
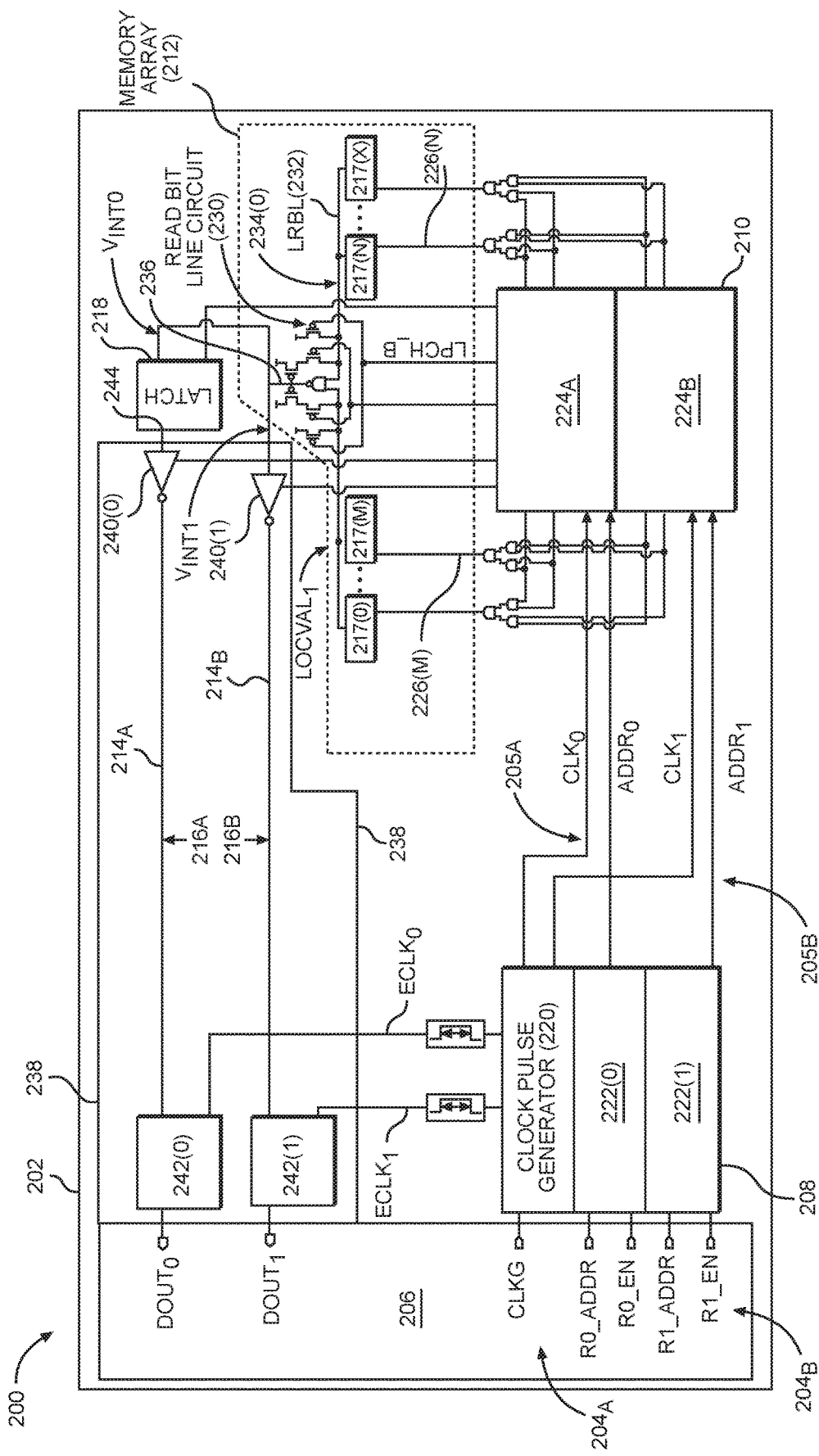
FIG. 2 is a schematic diagram of an exemplary double-pump memory array read circuit for sequentially executing parallel memory read operations to a memory array in a memory system.

Multi-pump memory system access circuits disclosed herein include a multi-pump memory array read circuit, such as the double-pump memory array read circuit ("DP read circuit") illustrated in FIG. 2. Before discussing exemplary multi-pump memory array read circuits that sequentially execute multiple memory read operations received in parallel, such as the DP read circuit in FIG. 2 below, a conventional memory array read circuit is first described in FIG. 1.

In this regard, FIG. 1 illustrates a conventional memory system 100 that receives a memory read operation request on a port from a processor or memory controller. The read request may be executed in a clock period. In response to the read request, the memory system 100 reads data from a memory array, and provides the data to the memory port for the processor or memory controller. In the memory system 100 a request 101 to read a data value (logical "0" or "1") of data stored in a memory bit cell 102 of a plurality of memory bit cells 102 in a memory array 106 is received on a memory system read port 104. In the memory system 100, the read request 101 may be received from a processor or memory controller (not shown), for example. The read request 101 is indicated by a read enable signal R0_EN, and a read address R0_ADDR of memory bit cells 102 to be accessed in the memory array 106. A global control circuit 108 receives the read request 101, and also receives a global clock signal CLKG employed to synchronize the memory system read port 104. The global control circuit 108 decodes the read address R0_ADDR and sends a decoded read address $ADDR_0$ to an array control circuit 110. The global control circuit 108 also sends a read clock signal $CLK_0$ based on the global clock signal CLKG. To read the memory bit cells 102 in the memory array 106 at the decoded read address $ADDR_0$, the array control circuit 110 precharges a local read bit line 112 in the memory array 106 to a predetermined voltage level. Memory bit cells 102 in memory array 106 may be implemented as 8T SRAM bit cells such that each memory bit cell 102 is coupled to a shared single ended bit line. Depending on implementation, the bit line may be precharged or discharged in advance of a read operation. The description herein is directed to the bit line, referred to as the local read bit line 112, which is charged in advance of a read operation in this example.

In response to receiving the decoded read address $ADDR_0$ and the read clock signal $CLK_0$, the array control circuit 110 discontinues precharging the local read bit line 112 and asserts a read word line 114 of the memory bit cell 102 corresponding to the decoded read address $ADDR_0$. As a result, the local read bit line 112 is pulled to a voltage level corresponding to a data value of the data stored in the memory bit cell 102. The array control circuit 110 generates a control signal 116 to control a coupler 118 to couple the local read bit line 112 to a global read bit line 120.

The global read bit line 120 is coupled between the memory array 106, or one of a plurality of memory arrays (not shown) of the memory system 100, and an evaluation circuit 122 (e.g., a latch 124) to provide the requested read data to the data bus $DOUT_0$ of the memory system read port 104. Consequently, the global read bit line 120 may have a high capacitance $C_{GRBL}$, which increases a charge time required for a voltage level $V_{GRBL}$ of the global read bit line 120 to stabilize in response to being coupled to the local read bit line 112. As shown in Equation 1 below, a total read access time ($T_{ACC\_R0}$) for a read request (R0) in the conventional memory system 100 includes a decode time ($T_{DEC}$) to decode the read address R0_ADDR, a memory array access time ($T_{LRBL}$) to read a data value of the memory bit cell 102 onto the local read bit line 112, and a global read bit line charge time ($T_{GRBL}$). To complete each read operation in a period (i.e., one cycle) of the global clock signal CLKG, the $T_{ACC\_R0}$ must be less than the period of the global clock signal CLKG.

$$T_{ACC\_R0} = T_{DEC} + T_{LRBL} + T_{GRBL} \qquad (1)$$

The memory bandwidth of the memory system 100 is the quantity of data that can be transferred to/from the memory system 100 in a period of the global clock signal CLKG, and the length of the clock period. Thus, the bandwidth of the memory system 100 is determined by the amount of data on the data bus $DOUT_0$, and the length of the period of the global clock signal CLKG, which must be greater than the total read access time $T_{ACC\_R0}$.

One option for improving bandwidth of the memory system 100 in FIG. 1 is to increase the number of access ports in the memory system 100. For example, the memory system 100 could be modified to include three (3) read ports and three (3) write ports for handling up to three read operations in parallel, and up to three write operations in parallel. Conventionally, in a memory system employing memory arrays with SRAM bit cells, a number of read ports or write ports of the memory system corresponds to a number of bit lines in the memory bit cells of a memory array. Adding bit lines to a memory bit cell to support parallel reads and parallel writes significantly increases the amount of circuitry employed to implement each memory bit cell (e.g., more transistors per bit cell). This increase in circuitry increases the chip area consumed by the memory array and increases the power consumed by the memory array. The added read bit lines can also increase the latency time for reading the memory array, increasing the memory array access time $T_{LRBL}$ to increase the total read access time $T_{ACC\_R0}$. It would be beneficial to increase the bandwidth of a memory system without significantly increasing the amount of circuitry required to implement the memory system.

FIG. 2 illustrates an exemplary DP read circuit 200 for sequentially executing parallel memory read operations received in a memory system 202. In the DP read circuit 200, first and second read ports $204_A$ and $204_B$ receive first and second memory read requests $205_A$ and $205_B$ in parallel in a two-port memory interface 206. The first read port $204_A$ of the two-port memory interface 206 includes a read address bus R0_ADDR and a first read enable signal R0_EN. The second read port $204_B$ includes a read address bus R1_ADDR and a second read enable signal R1_EN. The memory addresses on the read address buses R0_ADDR and R1_ADDR are decoded in parallel in a decoder control circuit 208, and the first and second decoded addresses $ADDR_0$ and $ADDR_1$ are provided to an array control circuit 210 to sequentially execute the first and second memory read requests $205_A$ and $205_B$ in a memory array 212. The two-port memory interface 206 also includes a first data bus $DOUT_0$ and a second data bus $DOUT_1$ associated with the first read port $204_A$ and the second read port $204_B$, respectively. The first and second read ports $204_A$ and $204_B$ receive first read data and second read data, respectively, from the memory array 212 on dedicated first and second global read bit lines $214_A$ and $214_B$, respectively. The first and second global read bit lines $214_A$ and $214_B$ are charged to first and second read data values $216_A$ and $216_B$, respectively, of a plurality of memory bit cells 217(0)-217(X) corresponding to the decoded memory addresses associated with the memory read operations received in parallel on the first and second read ports $204_A$ and $204_B$. To avoid suspending execution of the second memory read request $205_B$ in the memory array 212 while the first global read bit line $214_A$ is charged to the first read data value $216_A$ by the memory array 212, the first read data value $216_A$ from the first memory read request $205_A$ is directed to a data latch 218. The first global read bit line $214_A$ is charged to the first read data value $216_A$ by the data latch 218 while execution of the second memory read request $205_B$ commences in the memory array 212. The second read data value $216_B$ of the second memory read request $205_B$ may be charged onto the second global read bit line $214_B$ by the memory array 212.

With further reference to FIG. 2, the decoder control circuit 208 also receives a global clock signal CLKG which is a periodic clock pulse signal having a clock period $T_0$. The global clock signal CLKG is employed to synchronize the two-port memory interface 206. The decoder control circuit 208 includes a clock pulse generator circuit 220 that generates, in response to the global clock signal CLKG, a first request clock signal $CLK_0$ and a sequential second request clock signal $CLK_1$ in the clock period $T_0$. The decoder control circuit 208 also includes a first decoder circuit 222(0) and a second decoder circuit 222(1) to decode read addresses on the read address buses R0_ADDR and R1_ADDR, respectively. The first decoder circuit 222(0) generates the first decoded read address $ADDR_0$ corresponding to the first memory read request $205_A$ in the clock period $T_0$, and the second decoder circuit 222(1) generates the second decoded read address $ADDR_1$ corresponding to the second memory read request $205_B$, also in the clock period $T_0$.

The DP read circuit 200 includes the array control circuit 210 including a first array controller $224_A$ and a second array controller $224_B$. The array control circuit 210 controls sequencing of the parallel first and second memory read requests $205_A$ and $205_B$ to the memory array 212. The first array controller $224_A$ receives the first decoded read address $ADDR_0$ and the first request clock signal $CLK_0$. In response to the first request clock signal $CLK_0$, the first array controller $224_A$ activates a first read word line 226(M) corresponding to the first decoded read address $ADDR_0$. The first read word line 226(M) corresponds to a first memory bit cell 217(M) among the plurality of memory bit cells 217(0)-217(X), where X+1 indicates the number of memory bit cells in the memory array 212, and "M" is an integer number in the range from 0 to X. In response to the second request clock signal $CLK_1$, the second array controller $224_B$ activates a second read word line 226(N) corresponding to the second decoded read address $ADDR_1$. The second read word line 226(N) corresponds to a second memory bit cell 217(N) in the memory array 212, where "N" is an integer number in the range from 0 to X. The first decoded read address $ADDR_0$ may be the same or different than the second decoded read address $ADDR_1$. Thus, M may be the same or different than N in the clock period $T_0$.

The DP read circuit 200 includes a read bit line circuit 230, which controls reading data from the bit cells 217(0)-217(X) in the memory array 212. A precharge control signal LPCH_B to the read bit line circuit 230 is activated by the array control circuit 210 to precharge a local read bit line 232 (LRBL) in preparation for a memory read operation. In response to the first request clock signal $CLK_0$, the first array controller $224_A$ deactivates the precharge control signal LPCH_B and activates the first read word line 226(M) for the first memory read request $205_A$. In response to the first read word line 226(M) being activated, the read bit line circuit 230 sets the local read bit line 232 to the first read data value $216_A$ stored in the first memory bit cell 217(M) corresponding to the first decoded read address $ADDR_0$. As shown in FIG. 2, the read bit line circuit 230 couples the local read bit line 232 to an intermediate read bit line 236. By coupling the local read bit line 232 to the intermediate read bit line 236 in response to the first read word line 226(M) being activated, the read bit line circuit 230 sets the intermediate read bit line 236 to an intermediate value $V_{INT0}$ based on the first read data value $216_A$. The intermediate value $V_{INT0}$ may be a voltage level.

The intermediate read bit line 236 is coupled to the latch 218, which stores the first read data value $216_A$ (based on the value $V_{INT0}$) on the intermediate read bit line 236 in response to the first request clock signal $CLK_0$. The intermediate read bit line 236 has a lower capacitance than the global read bit line 120 in FIG. 1. Thus, a charge time $T_{INT}$ required for the intermediate value $V_{INT0}$ of the intermediate read bit line 236 to stabilize is shorter than the global read bit line charge time $T_{GRBL}$ discussed above. Consequently, the total read access time $T_{ACC\_R0}$ for the first memory read request $205_A$ to the DP read circuit 200 is shorter than in the memory system 100. Once the intermediate value $V_{INT0}$ is stabilized and the first read data value $216_A$ is stored in the latch 218, the read bit line circuit 230 may be decoupled from the local read bit line 232. The precharge control signal LPCH_B may be activated again to precharge the local read bit line 232 in preparation for the second memory read request $205_B$.

In response to the second read word line 226(N) being activated, the read bit line circuit 230 sets the local read bit line 232 to the second read data value $216_B$ stored in the second memory bit cell 217(N) corresponding to the second decoded read address $ADDR_1$. As shown in FIG. 2, the read bit line circuit 230 couples the local read bit line 232 to the intermediate read bit line 236. By coupling the local read bit line 232 to the intermediate read bit line 236 in response to the second read word line 226(N) being activated, the read bit line circuit 230 sets the intermediate read bit line 236 to an intermediate value $V_{INT1}$ corresponding to the second read data value $216_B$. In the above sequence, a charging time of the global read bit line $214_A$ for the first memory read request $205_A$ is overlapped in time with at least a portion of the second memory read request $205_B$.

The DP read circuit 200 includes an evaluation circuit 238 with first and second coupler circuits 240(0) and 240(1), and first and second evaluation latches 242(0) and 242(1). The clock pulse generator circuit 220 generates, in response to the global clock signal CLKG, a first evaluate clock signal $ECLK_0$ and a second evaluate clock signal $ECLK_1$ in the clock period $T_0$. The first coupler circuit 240(0) couples a data output 244 of the latch 218 to the first global read bit line $214_A$ to set the first global read bit line $214_A$ to the intermediate value $V_{INT0}$ corresponding to the first read data value $216_A$. The first global read bit line $214_A$ stabilizes while the second memory read request $205_B$ is executed. The first evaluation latch 242(0) evaluates the first global read bit line $214_A$ in response to the first evaluate clock signal $ECLK_0$ in the clock period $T_0$.

The second coupler circuit 240(1) couples the intermediate read bit line 236 to the second global read bit line $214_B$ to set the second global read bit line $214_B$ to the intermediate value $V_{INT1}$. The second evaluation latch 242(1) evaluates the second global read bit line 214$_B$ in response to the second evaluate clock signal ECLK$_1$. The data buses DOUT$_0$ and DOUT$_1$ receive the first read data value 216$_A$ stored in the first memory bit cell 217(N) and the second read data value 216$_B$ stored in the second memory bit cell 217(N), respectively, from the first and second evaluation latches 242(0) and 242(1). On the data buses DOUT0 and DOUT1, the first read data value 216$_A$ and the second read data value 216$_B$ are available in parallel for the processor(s) or memory controller(s) that issued the first read request 205$_A$ and the second read request 205$_B$.

With the DP read circuit 200 as disclosed above, two memory read requests 205A, 205B may be received in parallel on the two-port memory interface 206. The memory read address buses R0_ADDR and R1_ADDR for the first and second memory read requests 205$_A$ and 205$_B$ are decoded in parallel in the first decoder circuit 222(0) and second decoder circuit 222(1), respectively. The first and second memory read requests 205$_A$, 205$_B$ are sequentially executed on the memory array 212. The first data value 216$_A$ is read from the memory array 212, stored in the latch 218, and coupled to the first global read bit line 214$_A$ to charge the first global read bit line 214$_A$ to an intermediate value $V_{INT0}$ corresponding to the first read data value 216$_A$. The second read data value 216$_B$ is coupled to the second global read bit line 214$_B$ to charge the second global read bit line 214$_B$ to an intermediate value $V_{INT1}$ corresponding to the second read data value 216$_B$. In this regard, the first and second memory read requests 205$_A$, 205$_B$ are performed sequentially in less time than if executed sequentially on a single port by overlapping the charge time of the first global read bit line 214$_A$ with execution of the second memory read request 205$_B$. The DP read circuit 200 avoids a significant increase in the number of circuits associated with adding a read port to a memory array.

Figures 3A, 3B:
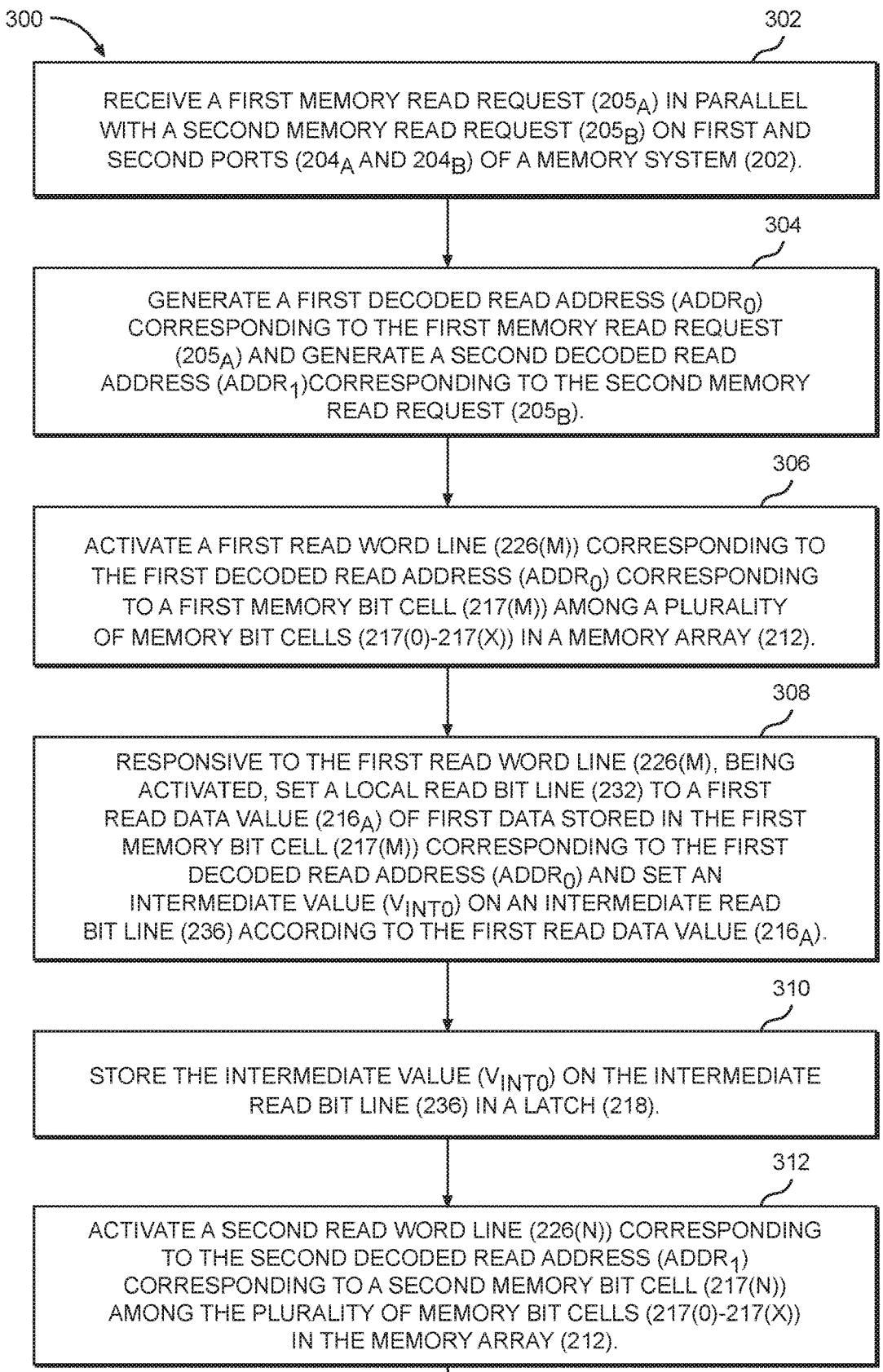
FIGS. 3A and 3B are a flowchart illustrating an exemplary process for sequentially executing two read operation requests received in parallel by double-pumping the single read port of the memory array.
Figure 3B:
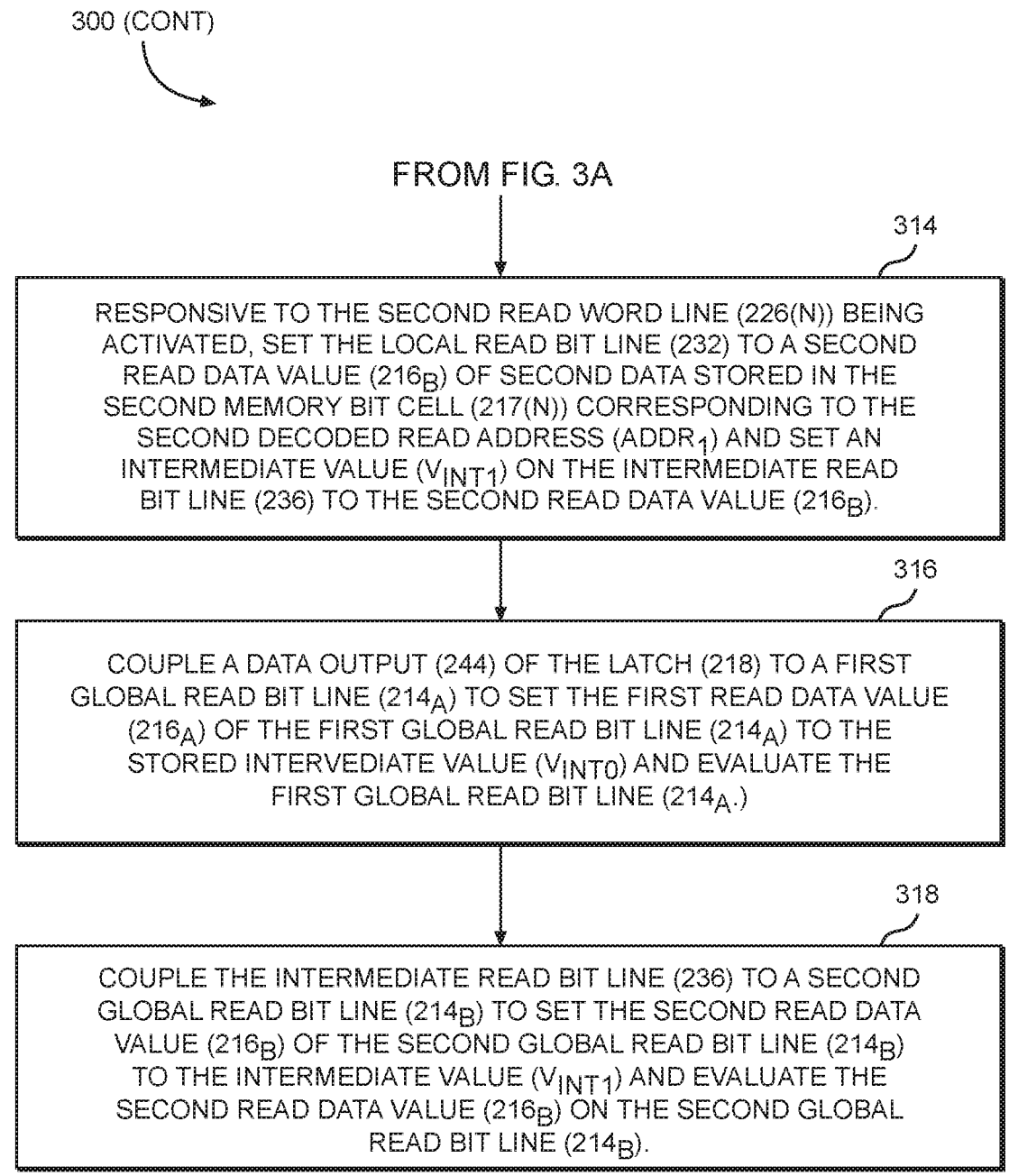

FIGS. 3A and 3B are a flowchart illustrating a process 300 of sequentially executing parallel memory operations in the memory system 202 of FIG. 2 employing the exemplary DP read circuit 200. The process 300 includes receiving a first memory read request 205$_A$ in parallel with a second memory read request 205$_B$ on first and second ports 204$_A$ and 204$_B$ of a memory system 202 (block 302). The process 300 includes generating a first decoded read address ADDR$_0$ corresponding to the first memory read request 205$_A$ and generating a second decoded read address ADDR$_1$ corresponding to the second memory read request 205$_B$ (block 304). The process 300 includes activating a first read word line 226(M) corresponding to the first decoded read address ADDR$_0$ corresponding to a first memory bit cell 217(M) among a plurality of memory bit cells 217(0)-217(X) in a memory array 212 (block 306). The process 300 includes, responsive to the first read word line 226(M) being activated, setting a local read bit line 232 to a first read data value 216$_A$ of first data stored in the first memory bit cell 217(M) corresponding to the first decoded read address ADDR$_0$ and setting an intermediate value $V_{INT0}$ on an intermediate read bit line 236 according to the first read data value 216$_A$ (block 308). The process 300 includes storing the intermediate value $V_{INT0}$ on the intermediate read bit line 236 in a latch 218 (block 310). The process 300 includes activating a second read word line 226(N) corresponding to the second decoded read address ADDR$_1$ corresponding to a second memory bit cell 217(N) among the plurality of memory bit cells 217(0)-217(X) in the memory array 212 (block 312). The process 300 includes, responsive to the second read word line 226(N) being activated, setting the local read bit line 232 to a second read data value 216$_B$ of second data stored in the second memory bit cell 217(N) corresponding to the second decoded read address ADDR$_1$ and setting an intermediate value $V_{INT1}$ on the intermediate read bit line 236 to the second read data value 216$_B$ (block 314). The process 300 includes coupling a data output 244 of the latch 218 to a first global read bit line 214$_A$ to set the first read data value 216$_A$ of the first global read bit line 214$_A$ to the stored intermediate value $V_{INT0}$ and evaluating the first global read bit line 214$_A$ (block 316). The process 300 includes coupling the intermediate read bit line 236 to a second global read bit line 214$_B$ to set the second read data value 216$_B$ of the second global read bit line 214$_B$ to the intermediate value $V_{INT1}$ and evaluating the second read data value 216$_B$ on the second global read bit line 214$_B$ (block 318).

FIGS. 4A-4F are timing diagrams that illustrate exemplary timing stages of memory read requests received in parallel and sequentially executed in the DP read circuit 200 in FIG. 2. Signals illustrated herein are shown as being asserted in either a high voltage state or a low voltage state, but the signals of the DP read circuit 200 are not limited to being asserted at a particular voltage level. A third signal that is activated by a second signal, where the second signal is activated by a first signal, is also activated by the first signal. In the timing diagrams in FIGS. 4A-4F, timing signals associated with the first and second read word lines 226(M) and 226(N) are indicated as "RWL(M)" and "RWL(N)," respectively, and the local read bit line 232 is indicated as "LRBL."

Figure 4A:
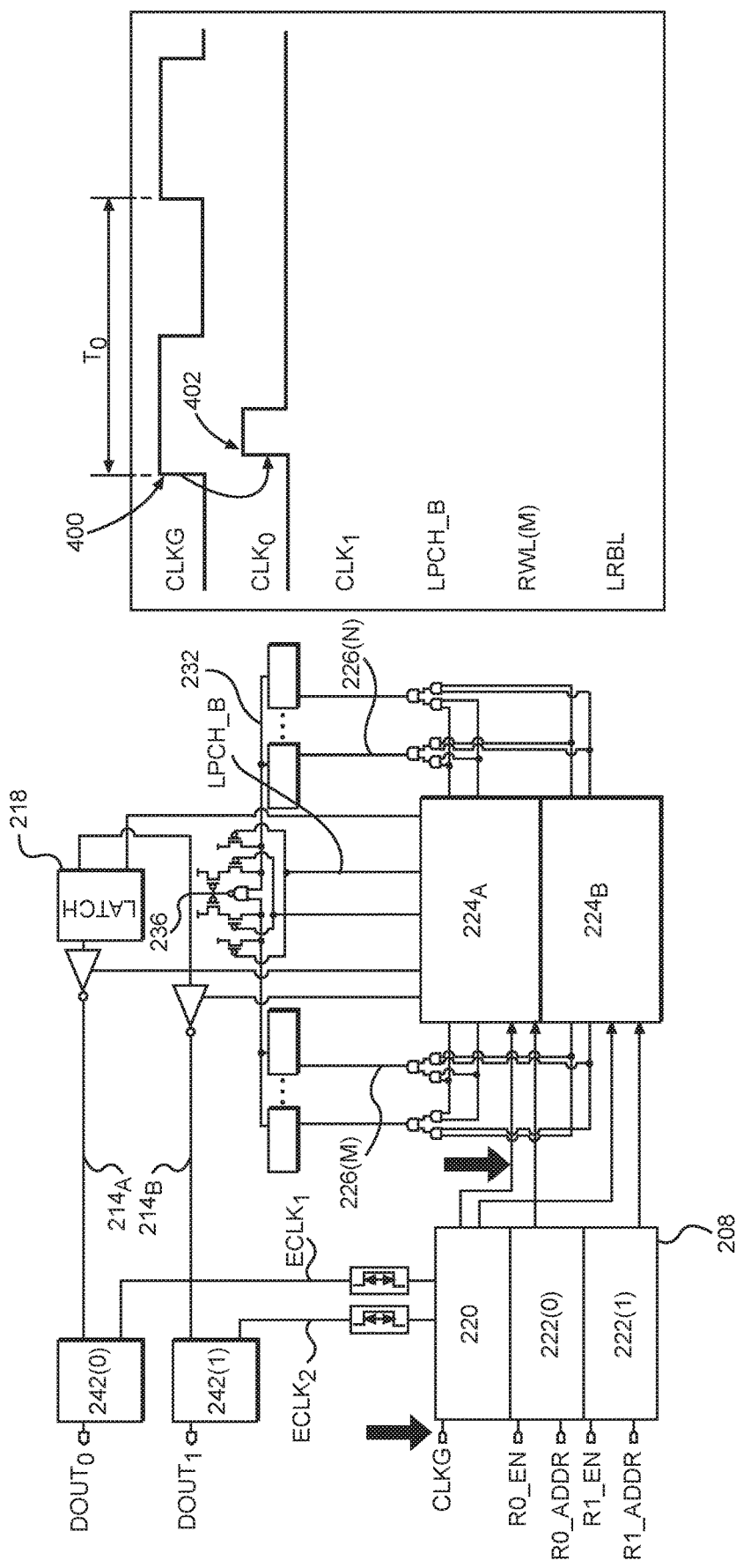
FIG. 4A is a diagram illustrating signal timing for a first stage of the double-pump memory array read circuit of FIG. 2 sequentially executing memory read requests received in parallel in the memory system.

FIG. 4A illustrates an exemplary first stage showing activation of the first request clock signal CLK$_0$ for the first memory read request 205$_A$. For example, the first memory read request 205$_A$ and the second memory read request 205$_B$ are received on the first and second read ports 204$_A$ and 204$_B$. The first read enable signal R0_EN is activated to indicate a valid address on the read address bus R0_ADDR, and the second read enable signal R1_EN is activated to indicate a valid address on the read address bus R1_ADDR. In response to a rising edge 400 asserting the global clock signal CLKG, the clock pulse generator circuit 220 begins sequencing the first and second memory read requests 205$_A$, 205$_B$ by generating a rising edge 402 asserting the first request clock signal CLK$_0$.

Figure 4B:
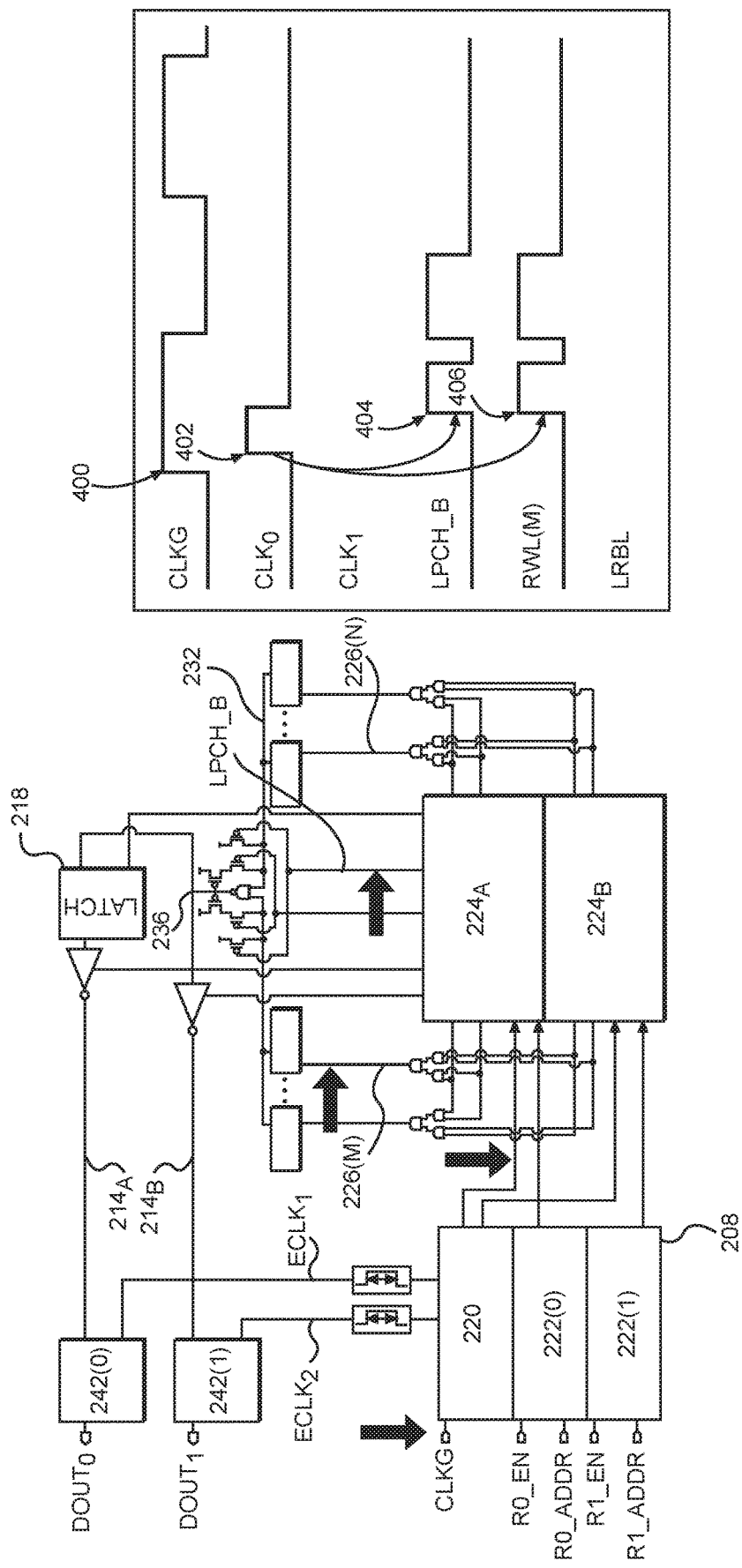
FIG. 4B is a diagram illustrating signal timing for a second stage of the double-pump memory array read circuit of FIG. 2 sequentially executing memory read requests received in parallel in the memory system.

FIG. 4B illustrates a second exemplary stage in which, in response to the rising edge 402 of the first request clock signal CLK$_0$, a rising edge 404 deasserts the precharge control signal LPCH_B to discontinue charging the local read bit line 232. In addition, in response to the first request clock signal CLK$_0$ rising edge 402, the first array controller 224, generates a rising edge 406 to assert the first read word line 226(M). Thus, the precharge control signal LPCH_B is deactivated, and the first read word line 226(M) is activated in response to the first request clock signal CLK$_0$. As discussed above, in response to the first read word line 226(M) being activated, the local read bit line 232 is set to the first read data value 216$_A$ stored in the memory bit cell 217(M).

Figure 4C:
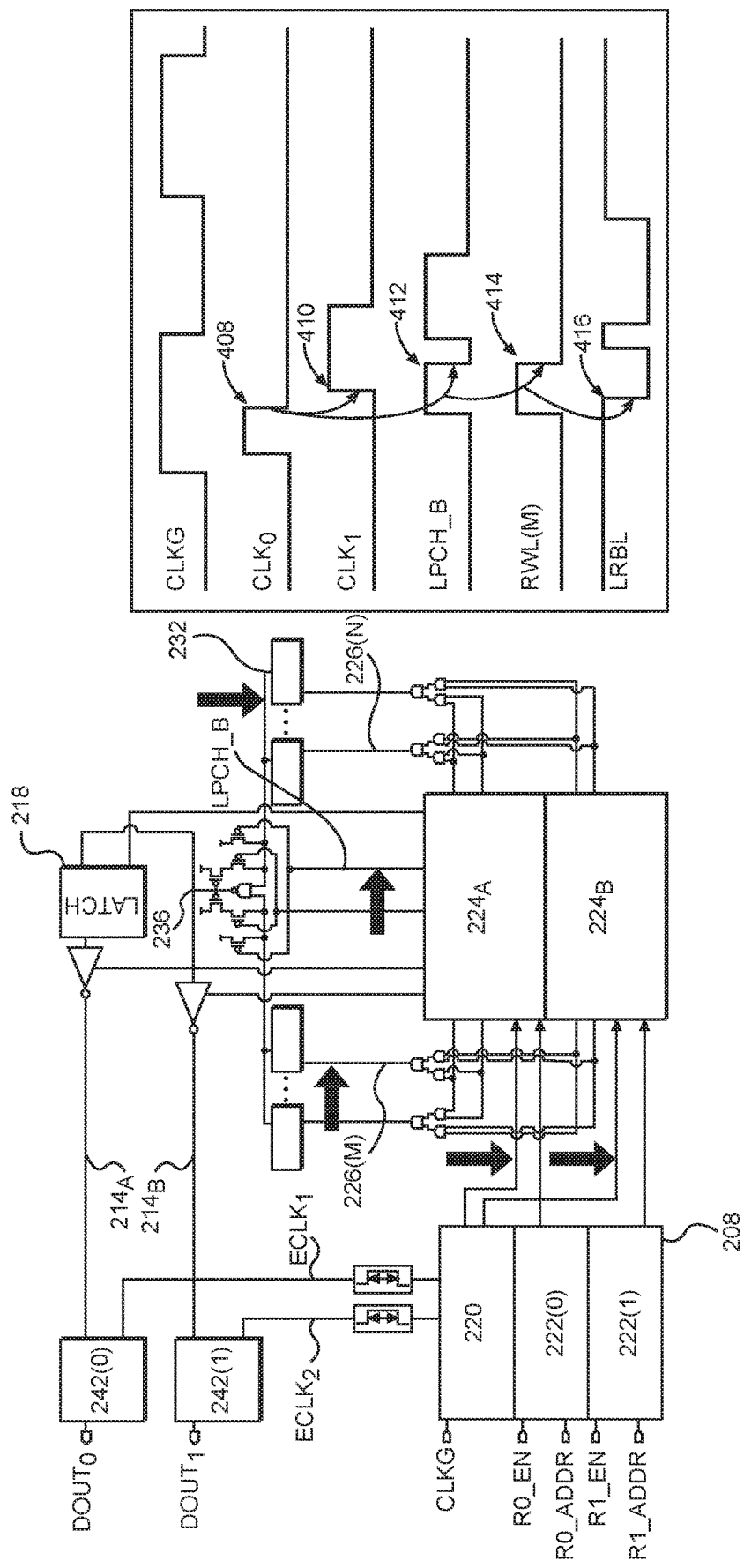
FIG. 4C is a diagram illustrating signal timing for a third stage of the double-pump memory array read circuit of FIG. 2 sequentially executing memory read requests received in parallel in the memory system.

FIG. 4C illustrates a third exemplary stage in which the first request clock signal CLK$_0$ is deasserted by a falling edge 408, indicating the end of the first memory read request 205$_A$ in the memory array 212. Because the intermediate read bit line 236 passes the first read data value 216$_A$ to the latch 218, the time for which the local read bit line 232 must maintain the first read data value 216$_A$ is reduced, and the local read bit line 232 is available to be precharged for the second memory read request 205$_B$ without waiting for the first global read bit line 216$_A$ to charge. In response to the falling edge 408, the second request clock signal $CLK_1$ is asserted by a rising edge 410, indicating the beginning of the second memory read request $205_B$. Thus, the first and second memory read requests $205_A$, $205_B$ are performed sequentially. Also in response to the falling edge 408, the precharge control signal LPCH_B is asserted by a falling edge 412 to begin precharging the local read bit line 232 for the second memory read request $205_B$, and the first read word line 226(M) is deasserted by a falling edge 414. At transition 416, in response to the first read word line 226(M), the local read bit line 232 is set to the first read data value $216_A$ stored in the first memory bit cell 217(M).

Figure 4D:
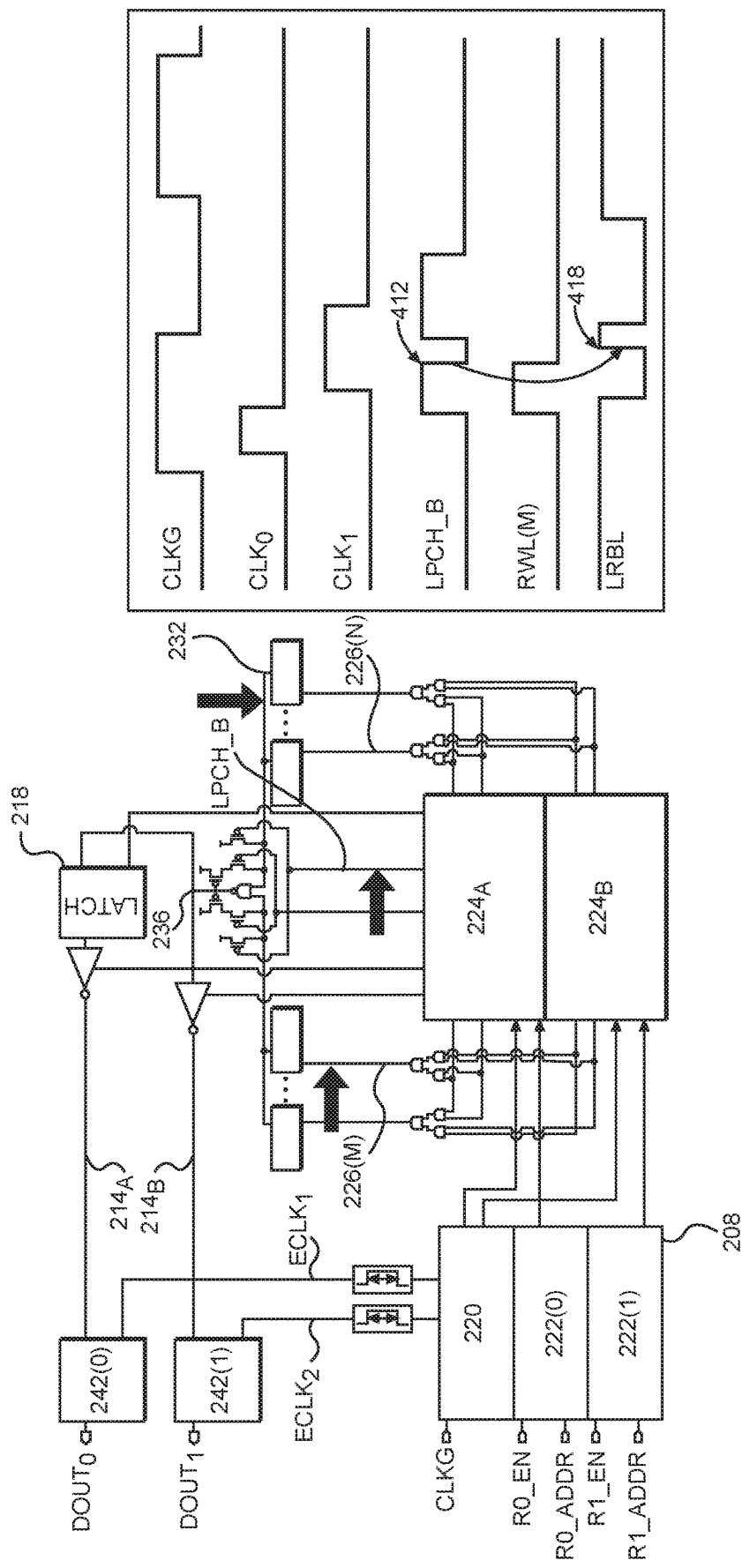
FIG. 4D is a diagram illustrating signal timing for a fourth stage of the double-pump memory array read circuit of FIG. 2 sequentially executing memory read requests received in parallel in the memory system.

FIG. 4D illustrates a fourth exemplary stage in which the local read bit line 232 begins precharging, as indicated at rising edge 418, in response to the falling edge 412 asserting the precharge control signal LPCH_B. The time between the first memory read request $205_A$ and the second memory read request $205_B$, during which the precharge control signal LPCH_B is asserted, is kept to the minimum time needed to precharge the local read bit line 232 to minimize the total time for sequential execution. During this time, the first global read bit line $214_A$ may be charged by the latch 218.

Figure 4E:
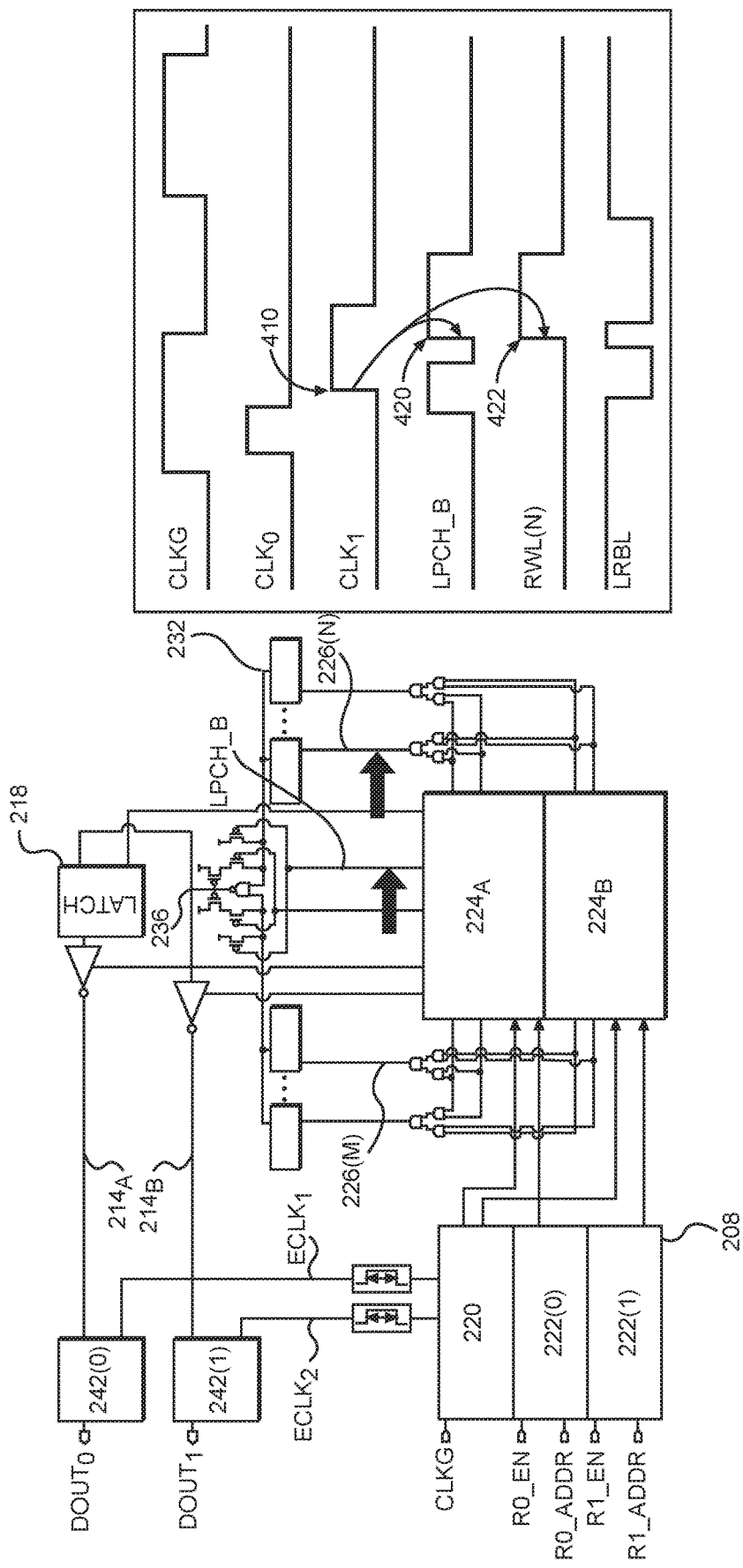
FIG. 4E is a diagram illustrating signal timing for a fifth stage of the double-pump memory array read circuit of FIG. 2 sequentially executing memory read requests received in parallel in the memory system.

FIG. 4E illustrates a fifth exemplary stage in which the second memory read request $205_B$ begins at the rising edge 410 of the second request clock signal $CLK_1$. In response to the rising edge 410, the precharge control signal LPCH_B is deasserted at a rising edge 420, allowing the second memory read request $205_B$ to begin in the memory array 212, and the second read word line 226(N) is asserted at a rising edge 422.

Figure 4F:
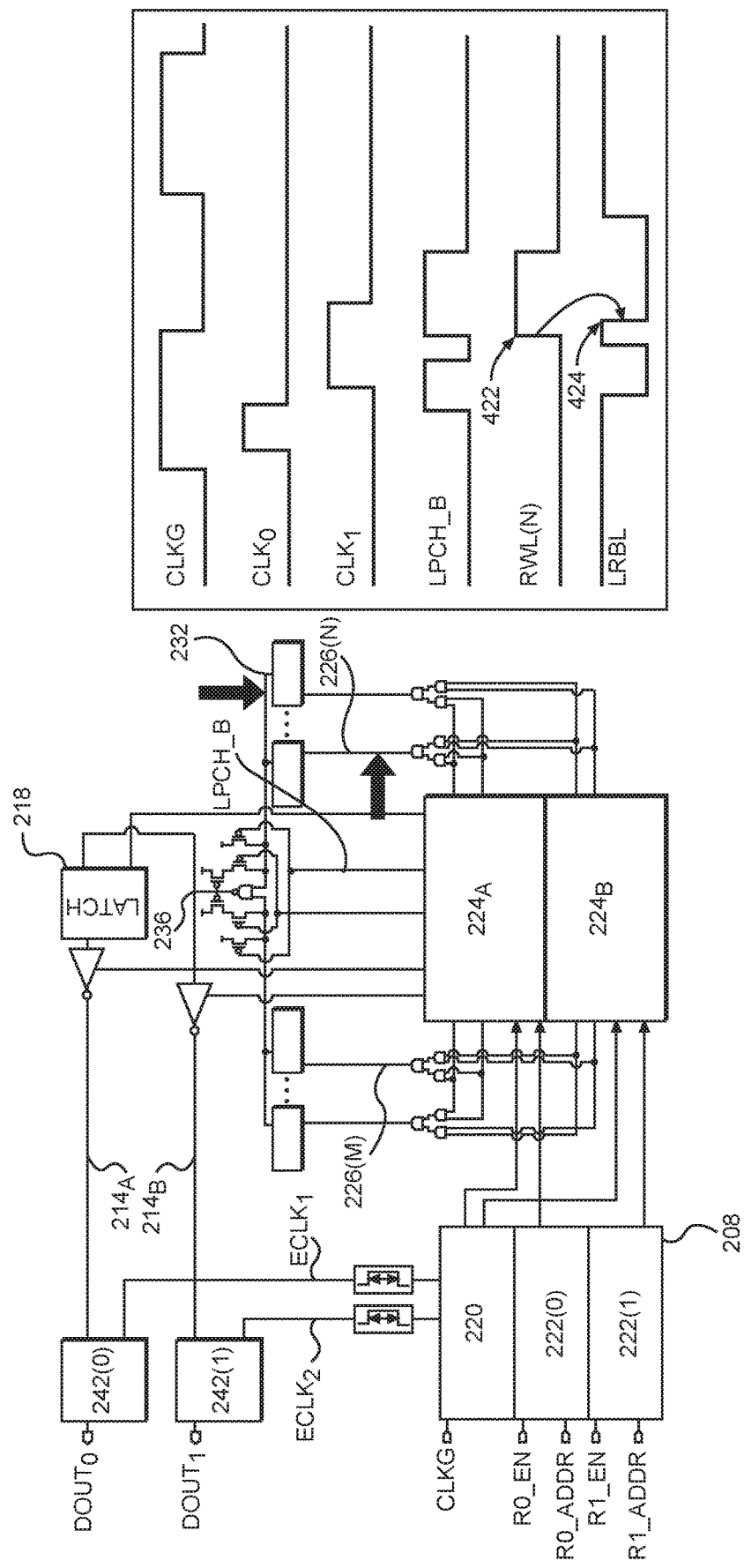
FIG. 4F is a diagram illustrating signal timing for a sixth stage of the double-pump memory array read circuit of FIG. 2 sequentially executing memory read requests received in parallel.

FIG. 4F illustrates a sixth exemplary stage in which the local read bit line 232 is set to the second data value $216_B$ in the second memory bit cell 217(N) at a falling edge 424 in response to the rising edge 422 of the second read word line 226(N). As a last sequentially executed read request of multiple read requests received in parallel, the second read data value 216 is maintained on the local read bit line 232 for a longer duration than in a previously executed read request, because the local read bit line 232 charges the second global read bit line $214_B$.

In a stage not illustrated herein, the first and second evaluation clock signals $ECLK_0$ and $ECLK_1$ are asserted, and the first and second read data values $216_A$ and $216_B$ on the first and second global read bit lines $214_A$ and $214_B$ are stored in the first and second evaluation latches 242(0) and 242(1), respectively, in the clock period $T_0$. Thus, the first and second read data values $216_A$ and $216_B$ are made available in parallel to a processor or memory controller on the data buses $DOUT_0$ and $DOUT_1$.

Figure 7:
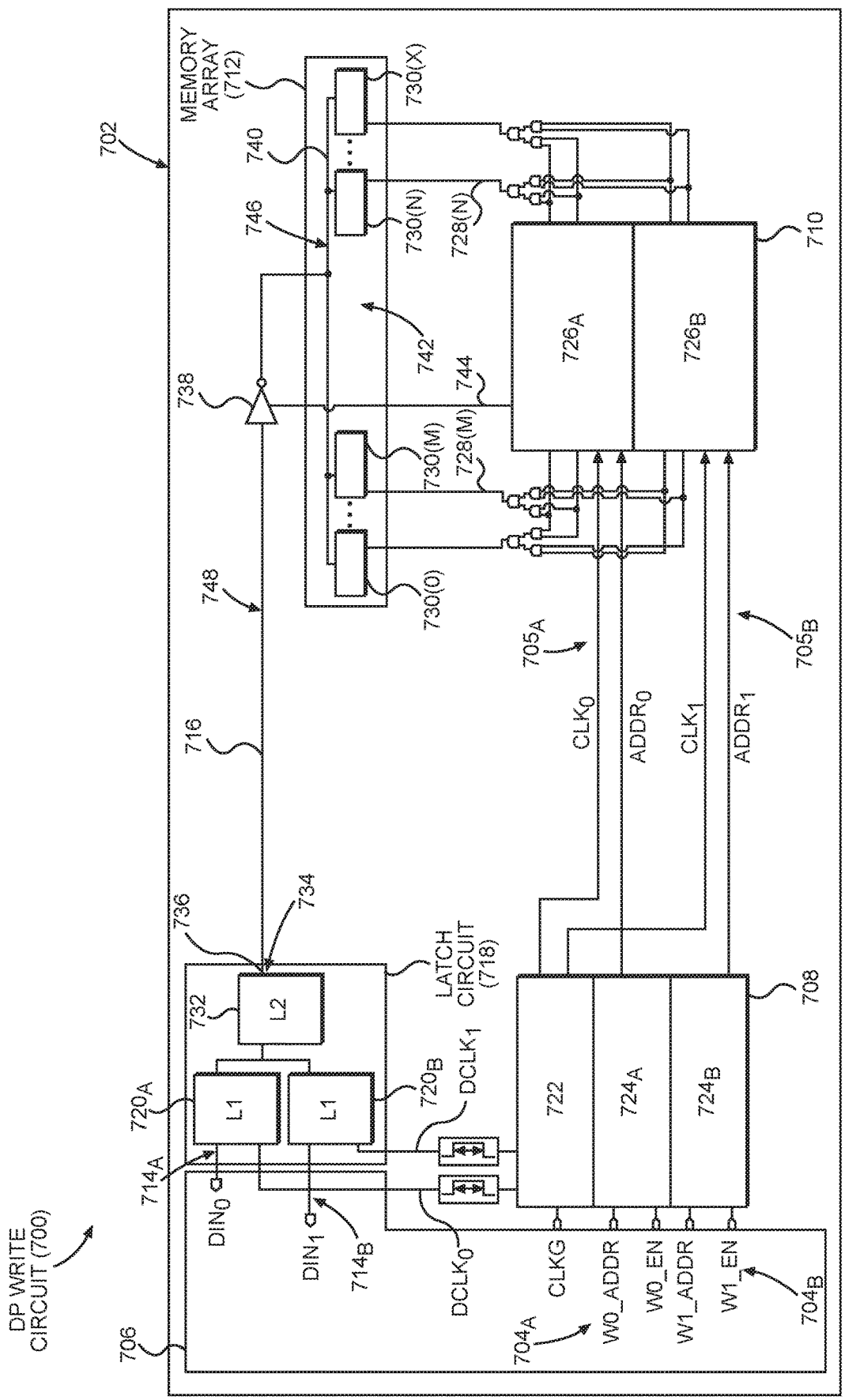
FIG. 7 is a diagram illustrating a double-pump memory array write circuit for sequentially executing parallel memory write operations.

Above, the timing diagrams in FIGS. 4A-4F illustrate sequential execution of first and second read requests received in parallel in the DP read circuit 200 in FIG. 2. However, to optimize bandwidth it is also beneficial to multi-pump write operations in a memory system. Below, an exemplary DP write circuit 700, as illustrated in FIG. 7, is described. However, before discussing the exemplary DP write circuit 700, a conventional memory array write circuit is first described in FIG. 5.

Figure 5:
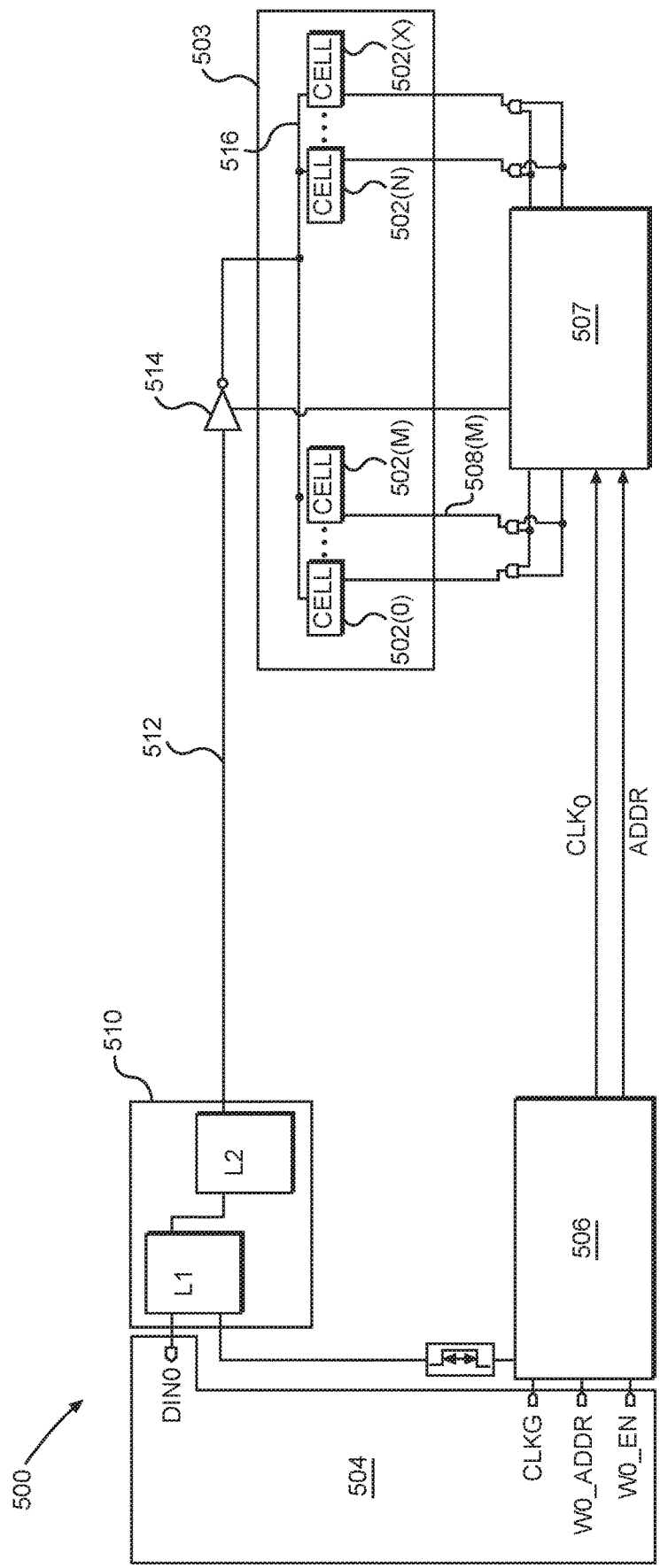
FIG. 5 is a schematic diagram of a conventional write circuit for a write port of a memory system to receive and execute a single request to write data into a memory bit cell of a memory array.

FIG. 5 illustrates a conventional memory system 500 that receives a memory write request on a write port from a processor or memory controller. As part of the write request, the memory system 500 receives write data and an address to which the write data is to be written. The memory system writes the write data into the memory address in the memory array to complete the write request. The write request may be executed in a period of a clock used to synchronize the write port. In the memory system 500 in FIG. 5, the write data is a data value (logical "0" or "1") that is written into one of a plurality of memory bit cells 502(0)-502(X) in a memory array 503. The memory system 500 includes a write port 504 including a global clock signal CLKG, a write enable signal W0_EN, a memory write address bus W0_ADDR, and a write data bus $DIN_0$. A global control circuit 506 decodes the memory write address W0_ADDR and generates a decoded write address ADDR. The global control circuit 506 also generates a write request clock signal $CLK_0$ based on the global clock signal CLKG. An array control circuit 507 receives the decoded write address ADDR and the write request clock signal $CLK_0$, and activates a write word line 508(M) to a memory bit cell 502(M) of the plurality of memory bit cells 502(0)-502(X) in the memory array 503.

The write data bus $DIN_0$ receives write data that is stored in a conventional L1/L2 latch 510. An output of the latch 510 is coupled to a global write bit line 512. The array control circuit 507 activates a coupler 514 to couple the global write bit line 512 to a local write bit line 516. In this way, the data value received on write data bus $DIN_0$ is transferred to the local write bit line 516 by way of the global write bit line 512. In response to the write word line 508(M) being activated by the array control circuit 507, the data value on the local write bit line 516 is stored in the memory bit cell 502(M) corresponding to the decoded write address ADDR.

Figure 6A:
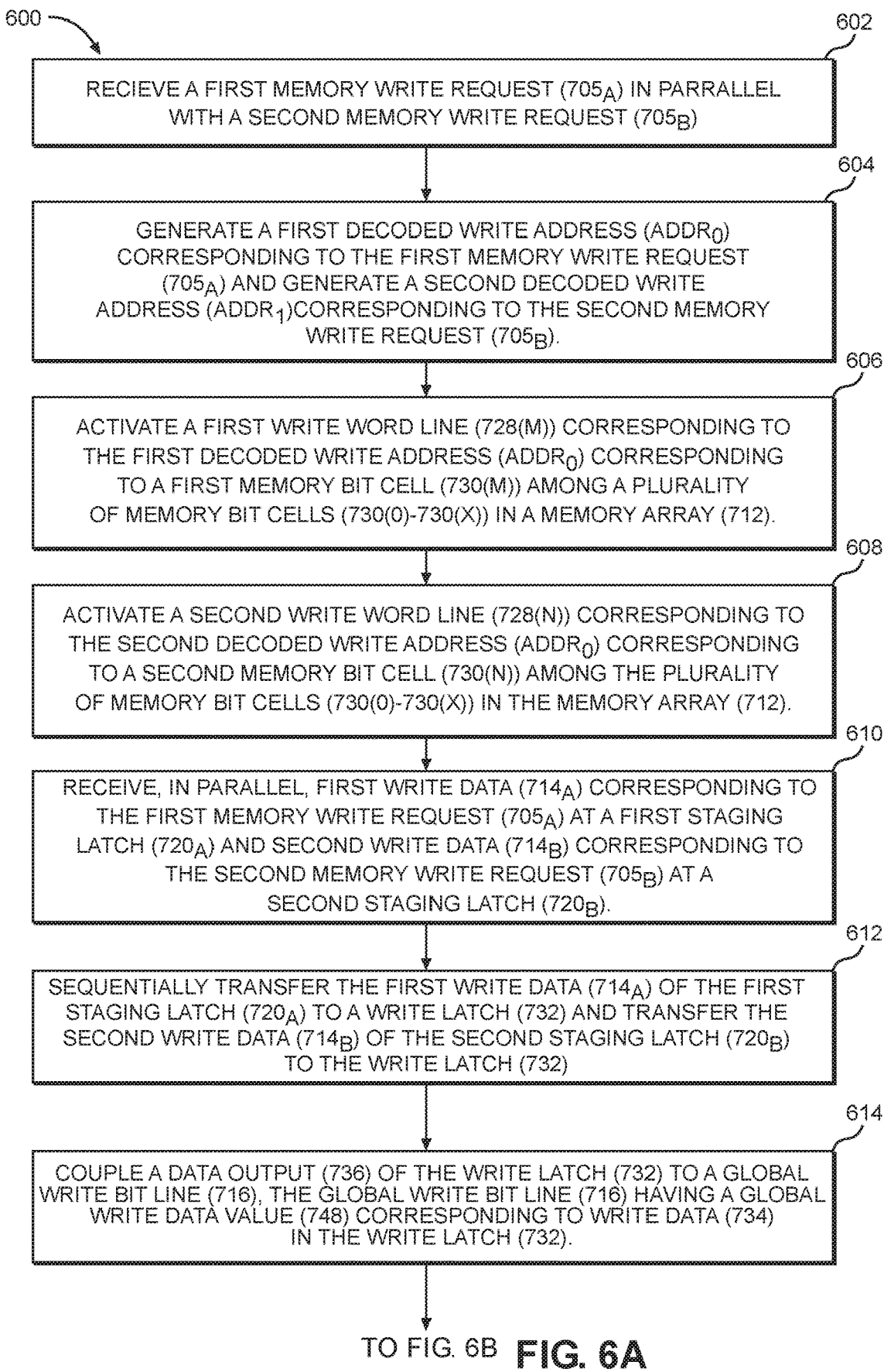
FIGS. 6A and 6B are a flowchart illustrating an exemplary process for sequentially executing two write requests received in parallel by double-pumping a single read port of a memory array.
Figure 6B:
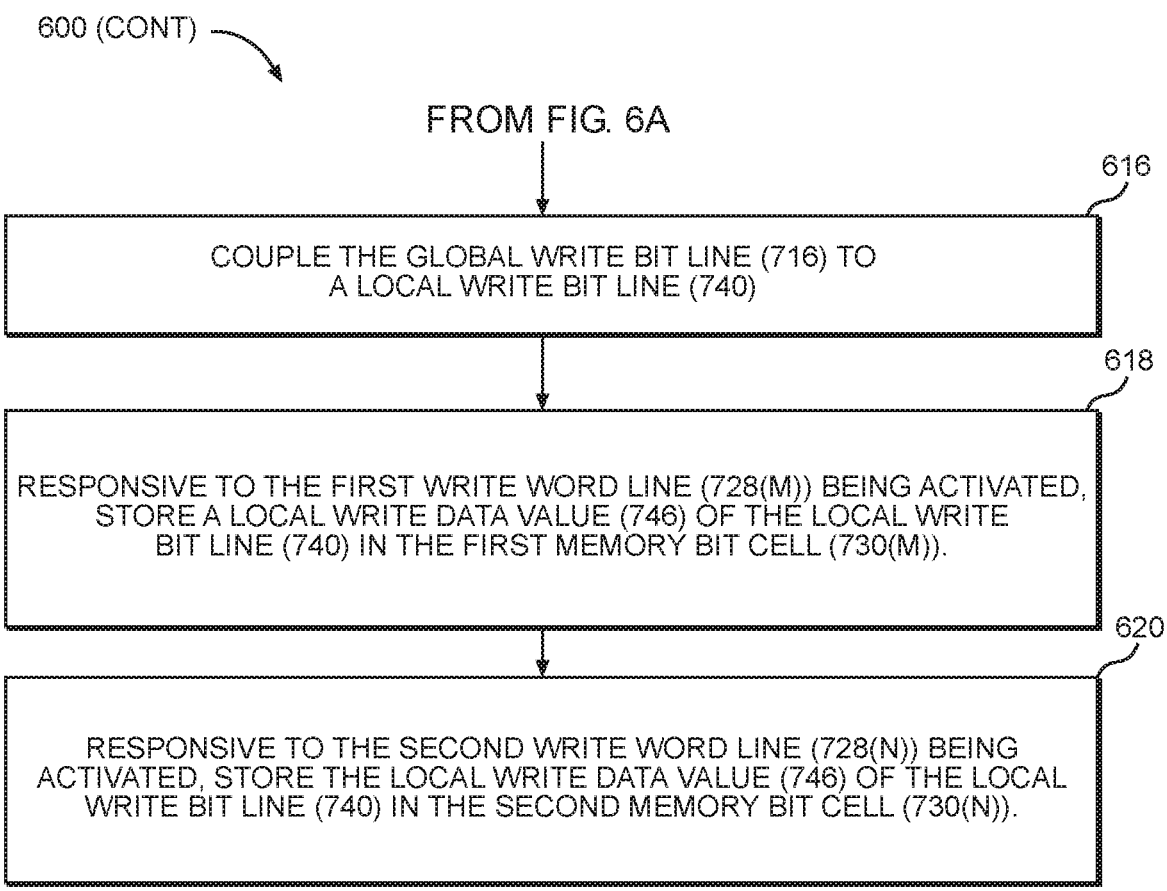

FIGS. 6A and 6B are a flowchart illustrating a process 600 of sequentially executing parallel memory operations in a memory system 702 employing an exemplary DP write circuit 700 illustrated in FIG. 7. The process 600 is described with reference to the DP write circuit 700 in FIG. 7, which is described in detail below. The process 600 includes receiving a first memory write request $705_A$ in parallel with a second memory write request $705_B$ (block 602). The process 600 includes generating a first decoded write address $ADDR_0$ corresponding to the first memory write request $705_A$ and generating a second decoded write address $ADDR_1$ corresponding to the second memory write request $705_B$ (block 604). The process 600 includes activating a first write word line 728(M) corresponding to the first decoded write address $ADDR_0$ corresponding to a first memory bit cell 730(M) among a plurality of memory bit cells 730(0)-730(X) in a memory array 712 (block 606). The process 600 includes activating a second write word line 728(N) corresponding to the second decoded write address $ADDR_1$ corresponding to a second memory bit cell 730(N) among the plurality of memory bit cells 730(0)-730(X) in the memory array 712 (block 608). The process 600 includes receiving, in parallel, first write data $714_A$ corresponding to the first memory write request $705_A$ at a first staging latch $720_A$ and second write data $714_B$ corresponding to the second memory write request $705_B$ at a second staging latch $720_B$ (block 610). The process 600 includes sequentially transferring the first write data $714_A$ of the first staging latch $720_A$ to a write latch 732 and transferring the second write data 714 of the second staging latch $720_B$ to the write latch 732 (block 612). The process 600 includes coupling a data output 736 of the write latch 732 to a global write bit line 716, the global write bit line 716 having a global write data value 748 corresponding to write data 734 in the write latch 732 (block 614). The process 600 includes coupling the global write bit line 716 to a local write bit line 740 (block 616). The process 600 includes, responsive to the first write word line 728(M) being activated, storing a local write data value 746 of the local write bit line 740 in the first memory bit cell 730(M) (block 618). The process 600 includes, responsive to the second write word line 728(N) being activated, storing the local write data value 746 of the local write bit line 740 in the second memory bit cell 730(N) (block 620).

As discussed above with regard to the DP read circuit 200 in FIG. 2, the bandwidth of a memory system may be increased by increasing a number of read ports and write ports over which multiple parallel memory read and write operations can be performed. FIG. 7 illustrates the exemplary DP write circuit 700 for sequentially executing parallel memory write operations received in the memory system 702. In the DP write circuit 700, first and second write ports 704$_A$ and 704$_B$ receive the first and second memory write requests 705$_A$ and 705$_B$ in parallel in a two-port memory interface 706. The first write port 704A includes a first write address W0_ADDR, a first write enable signal W0_EN, and a first write data bus DIN$_0$. The second write port 704$_B$ includes a second write address W1_ADDR, a second write enable signal W1_EN, and a second write data bus DIN$_1$. The memory addresses W0_ADDR and W1_ADDR are decoded in parallel in a decoder control circuit 708, and the decoded addresses ADDR$_0$ and ADDR$_1$ are provided to an array control circuit 710 to sequentially execute the first and second memory write requests 705$_A$ and 705$_B$ in the memory array 712. The first and second write data 714$_A$ and 714$_B$ associated with the first and second memory write requests 705$_A$ and 705$_B$ are received in the memory array 712 by way of the global write bit line 716. The first and second write data buses DIN$_0$ and DIN$_1$ are coupled to a latch circuit 718 including the first and second staging latches 720$_A$ and 720$_B$, such that the first and second write data 714$_A$ and 714$_B$ are received in parallel in the latch circuit 718. The latch circuit 718 sequentially transfers the first and second write data 714$_A$ and 714$_B$ without a multiplexer circuit that would be needed if, for example, the first and second write data 714$_A$ and 714$_B$ are stored in separate L1/L2 latches from the first and second write data buses DIN$_0$ and DIN$_1$.

With further reference to FIG. 7, the two-port memory interface 706 also receives a global clock signal CLKG employed to synchronize write requests over the two-port memory interface 706. The decoder control circuit 708 includes a clock pulse generator circuit 722 that generates, in response to the global clock signal CLKG, a first request clock signal CLK$_0$ and a sequential second request clock signal CLK$_1$ in a clock period T$_0$ of the global clock signal CLKG. The decoder control circuit 708 further includes a first decoder circuit 724$_A$ that generates the first decoded write address ADDR$_0$ corresponding to the first memory write request 705$_A$, and a second decoder circuit 724$_B$ that generates the second decoded write address ADDR$_1$ corresponding to the second memory write request 705$_B$.

The array control circuit 710 includes a first array controller 726$_A$ and a second array controller 726$_B$. The first array controller 726$_A$ receives the first decoded write address ADDR$_0$ and the first request clock signal CLK$_0$. In response to the first request clock signal CLK$_0$, the first array controller 726$_A$ activates the first write word line 728(M) corresponding to the first decoded write address ADDR$_0$. The first write word line 728(M) corresponds to the first memory bit cell 730(M) among the plurality of memory bit cells 730(0)-730(X), where X+1 indicates the number of memory bit cells in the memory array 712 and "M" is an integer in the range from 0 to X. In response to the second request clock signal CLK$_1$, the second array controller 726$_B$ activates the second write word line 728(N). The second write word line 728(N) corresponds to the second memory bit cell 730(N) in the memory array 712, where "N" is an integer in the range from 0 to X. The first decoded write address ADDR$_0$ may be the same as the second decoded write address ADDR$_1$.

The latch circuit 718 differs from the single input L1/L2 latch 510 conventionally employed in the memory system 500 of FIG. 5. The latch circuit 718 receives, in parallel, the first write data bus DIN$_0$ corresponding to the first memory write request 705$_A$ into the first staging latch 720$_A$, and the second write data bus DIN$_1$ corresponding to the second memory write request 705$_B$ into the second staging latch 720$_B$. The latch circuit 718 includes the write latch 732, and the latch circuit 718 is configured to selectively transfer data stored in the first staging latch 720$_A$ or in the second staging latch 720$_B$ into the write latch 732. The clock pulse generator circuit 722 in the decoder control circuit 708 generates a first write data clock DCLK$_0$ and a second write data clock DCLK$_1$ based on the global clock signal CLKG. The first and second write data clocks DCLK$_0$ and DCLK$_1$ control sequential transfer of the first write data 714$_A$ in the first staging latch 720$_A$ and the second write data 714$_B$ in the second staging latch 720$_B$, respectively, to the write latch 732.

With further reference to FIG. 7, the global write bit line 716 receives the write data 734 on the data output 736 of the latch circuit 718. A coupling circuit 738 couples the global write bit line 716 to the local write bit line 740 included in a local write bit line circuit 742 in the memory array 712. The coupling circuit 738 is enabled by a local write bit line enable signal 744 to couple the global write bit line 716 to the local write bit line 740 to set the local write data value 746 on the local write bit line 740 to the global write data value 748 on the global write bit line 716. The local write bit line enable signal 744 is first activated in response to the first request clock signal CLK$_0$, and subsequently activated in response to the second request clock signal CLK$_1$. As described above, the first array controller 726$_A$ activates the first write word line 728(M) corresponding to the first decoded write address ADDR$_0$ in response to the first request clock signal CLK$_0$. In response to the first write word line 728(M) being activated, the local write data value 746 on the local write bit line 740 is stored in the first memory bit cell 730(M) corresponding to the first decoded write address ADDR$_0$. Similarly, the second array controller 726$_B$ activates the second write word line 728(N) corresponding to the second decoded write address ADDR$_1$ in response to the second request clock signal CLK$_0$. In response to the second write word line 728(N) being activated, the local write data value 746 on the local write bit line 740 is stored in the second memory bit cell 730(N) corresponding to the second decoded write address ADDR$_1$. Thus, by employing the first and second request clock signals CLK$_0$ and CLK$_1$ sequentially couple the first and second write data 714$_A$ and 714$_B$ from the latch circuit 718 to the global write bit line 716 and the local write bit line 740, and to sequentially activate the first and second write word lines 728(M) and (728(N), the first and second write data 714$_A$ and 714$_B$ are sequentially written into the memory bit cells 730(M) and 730(N), respectively.

Keeping in mind that the L1/L2 latch 510 of FIG. 5 has a single data input (i.e., to the L1 portion), which is typically shifted from the L1 portion to the L2 portion once per period of a global clock, a DP write circuit design employing two separate L1/L2 latches 510 to receive the first and second write data 714A and 714B from the first and second write data buses DIN$_0$ and DIN$_1$ would require a multiplexer to sequentially transfer the first and second write data 714A and 714B onto the global write bit line 716. Such design would require a longer time to write data to the memory array 712 due to the additional multiplexer delay. Thus, the DP write circuit 700 in this example is configured to sequentially store the first and second write data 714$_A$ and 714$_B$ in the memory array 712 in the same clock period of the global clock signal CLKG, and the latch circuit 718 decreases a total time for the sequential write operations.

FIGS. 8A-8F include timing diagrams illustrating exemplary stages of sequentially executing memory write requests received in parallel in the DP write circuit 700 of FIG. 7. Signals illustrated herein are shown as being asserted in either a high voltage state or a low voltage state, but the signals of the DP write circuit 700 are not limited to being asserted at a particular voltage level. A third signal that is illustrated as being activated by a second signal, where the second signal is illustrated as being activated by a first signal, is also activated by the first signal.

In the timing diagrams in FIGS. 8A-8F, the global write data value 748 on the global write bit line 716 is labeled "GWBL," the local write bit line enable signal 744 is labeled "LWBL_EN," the local write data value 746 on the local write bit line 740 is labeled "LWBL," and the first and second write word lines 728(M) and 728(N) are labeled "WWL(M)" and "WWL(N)," respectively.

Figure 8A:
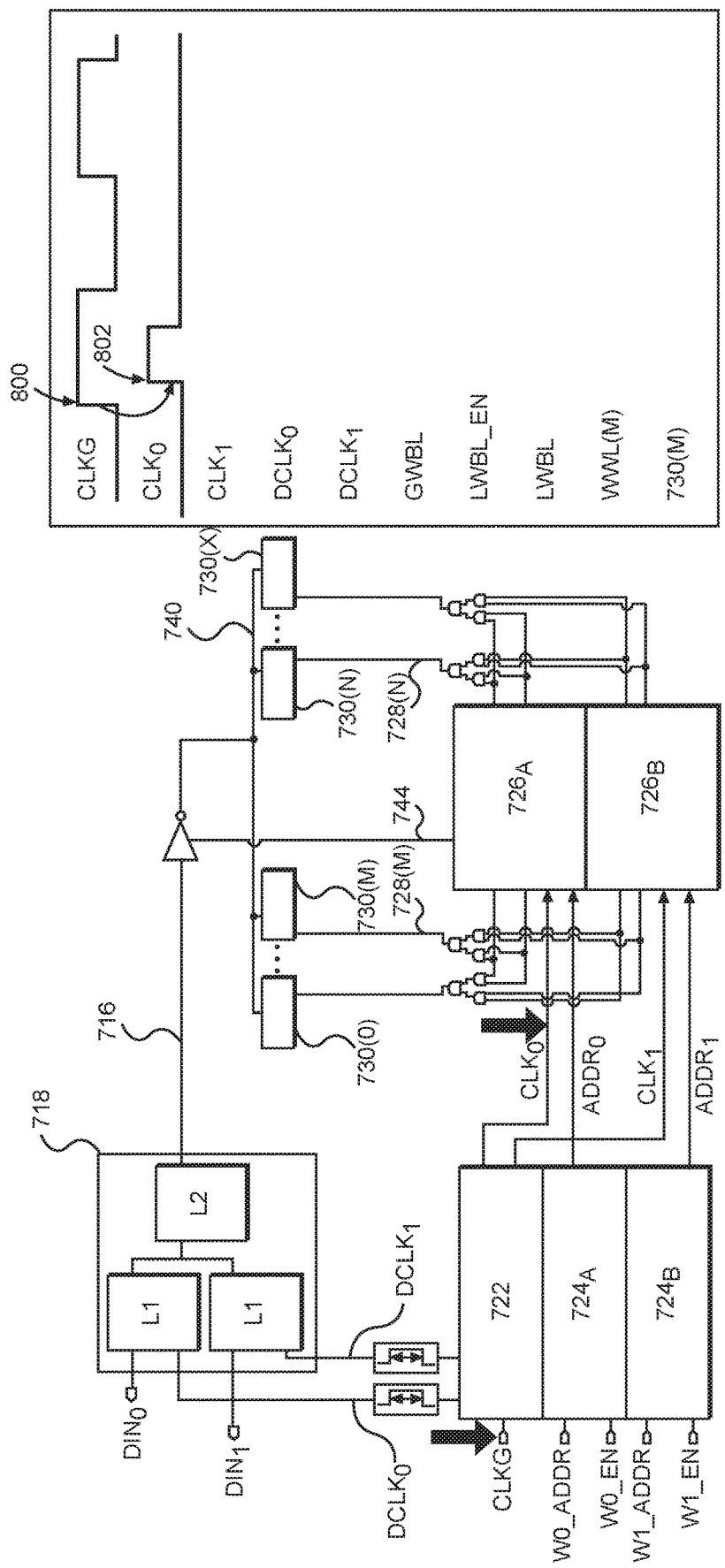
FIG. 8A is a diagram illustrating signal timing for a first stage of sequentially executing memory write requests received in parallel.

FIG. 8A illustrates a first exemplary stage showing activation of the global clock signal CLKG, and the first request clock signal CLK$_0$ for the first memory write request 705$_A$. As shown, in response to a rising edge 800 asserting the global clock signal CLKG, a rising edge 802 asserting the first request clock signal CLK$_0$ follows. Thus, the first request clock signal CLK$_0$ is activated in response to the global clock signal CLKG.

Figure 8B:
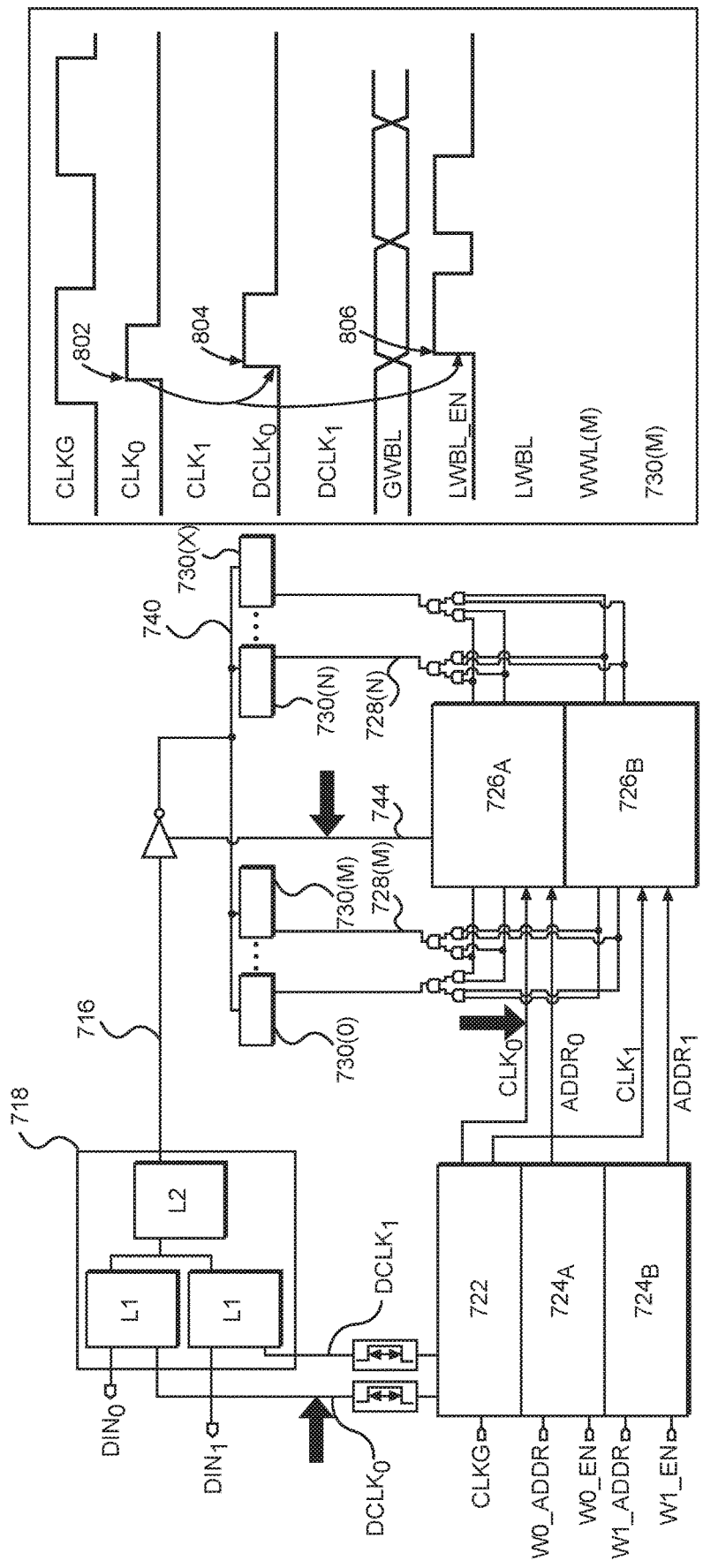
FIG. 8B is a diagram illustrating signal timing for a second stage of the double-pump memory array write circuit of FIG. 7 sequentially executing memory write requests received in parallel.

FIG. 8B illustrates a second exemplary stage showing, in response to the rising edge 802 of the first request clock signal CLK$_0$, activation of the first write data clock DCLK$_0$ by a rising edge 804 and activation of the local write bit line enable signal 744 by a rising edge 806 for the first memory write request 705$_A$. As a result, the coupling circuit 738 begins coupling the global write bit line 716 to the local write bit line 740 for the first write request 705$_A$.

Figure 8C:
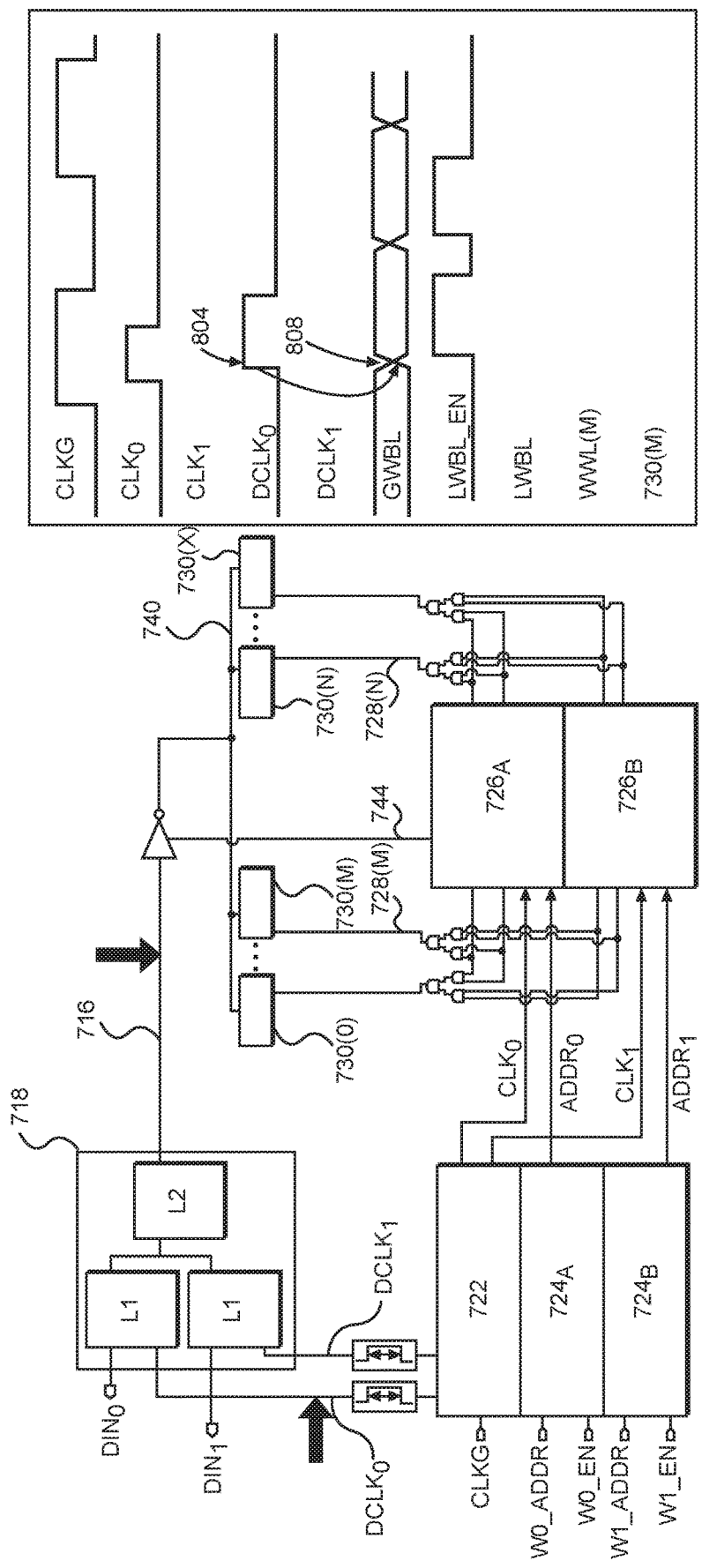
FIG. 8C is a diagram illustrating signal timing for a third stage of the double-pump memory array write circuit of FIG. 7 sequentially executing memory write requests received in parallel.

FIG. 8C illustrates a third exemplary stage showing, in response to the rising edge 804 of the first write data clock DCLK$_0$, transferring the first write data 714$_A$ in the first staging latch 720$_A$ to the write data 734 on the data output 736 of the write latch 732, to set the global write data value 748 on the global write bit line 716 at transition 808. The global write bit line 716 receives the first write data 714$_A$ on the data output 736.

Figure 8D:
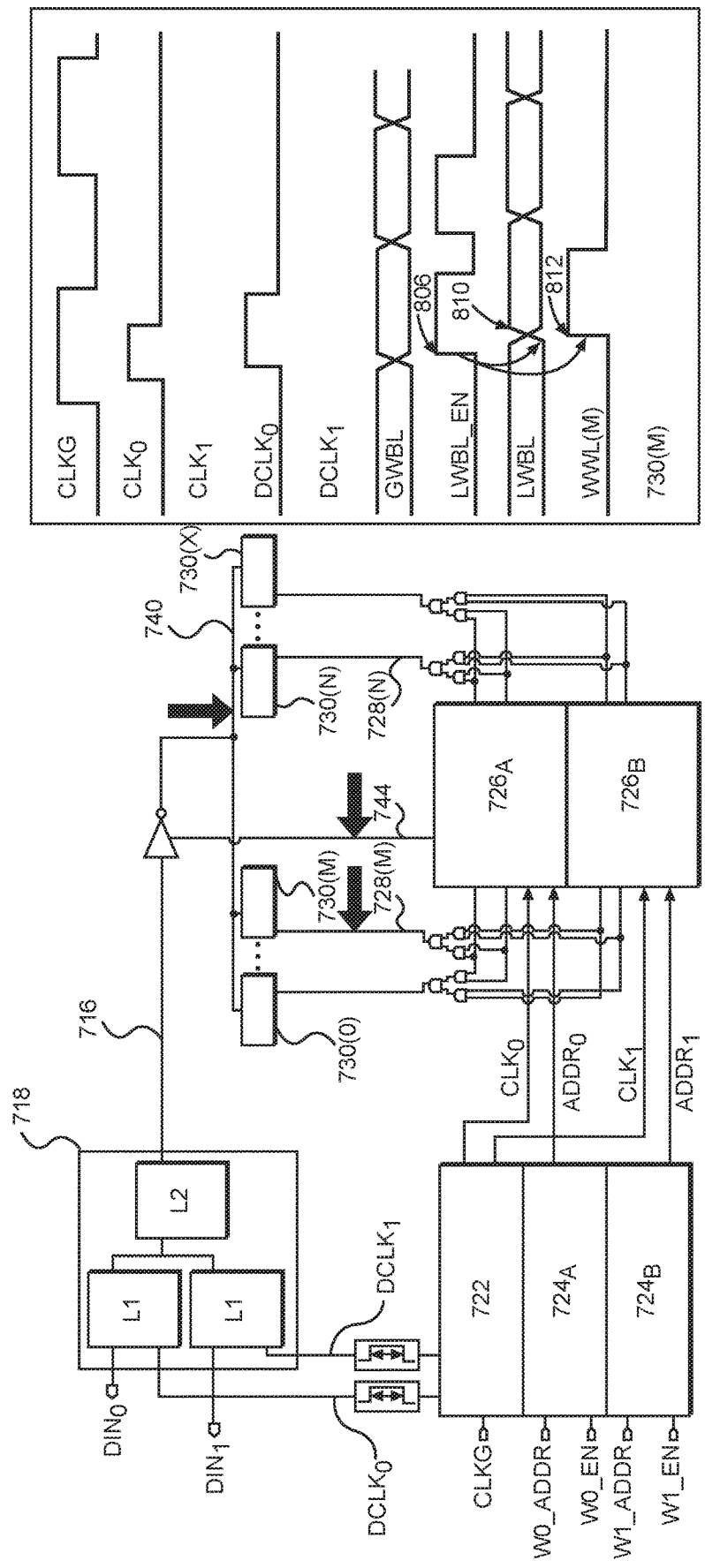
FIG. 8D is a diagram illustrating signal timing for a fourth stage of the double-pump memory array write circuit of FIG. 7 sequentially executing memory write requests received in parallel.

FIG. 8D illustrates a fourth exemplary stage showing the local write data value 746 of the local write bit line 740 being set to the global write data value 748 at 810 in response to the rising edge 806 of the local write bit line enable signal 744, and showing the first write word line 728(M) being activated by a rising edge 812 in response to the rising edge 806 of the local write bit line enable signal 744. The first write data 714$_A$ on the global write bit line 716 is passed to the local write bit line 740, and the first write word line 728(M) is activated to enable a write to the first memory bit cell 730(M).

Figure 8E:
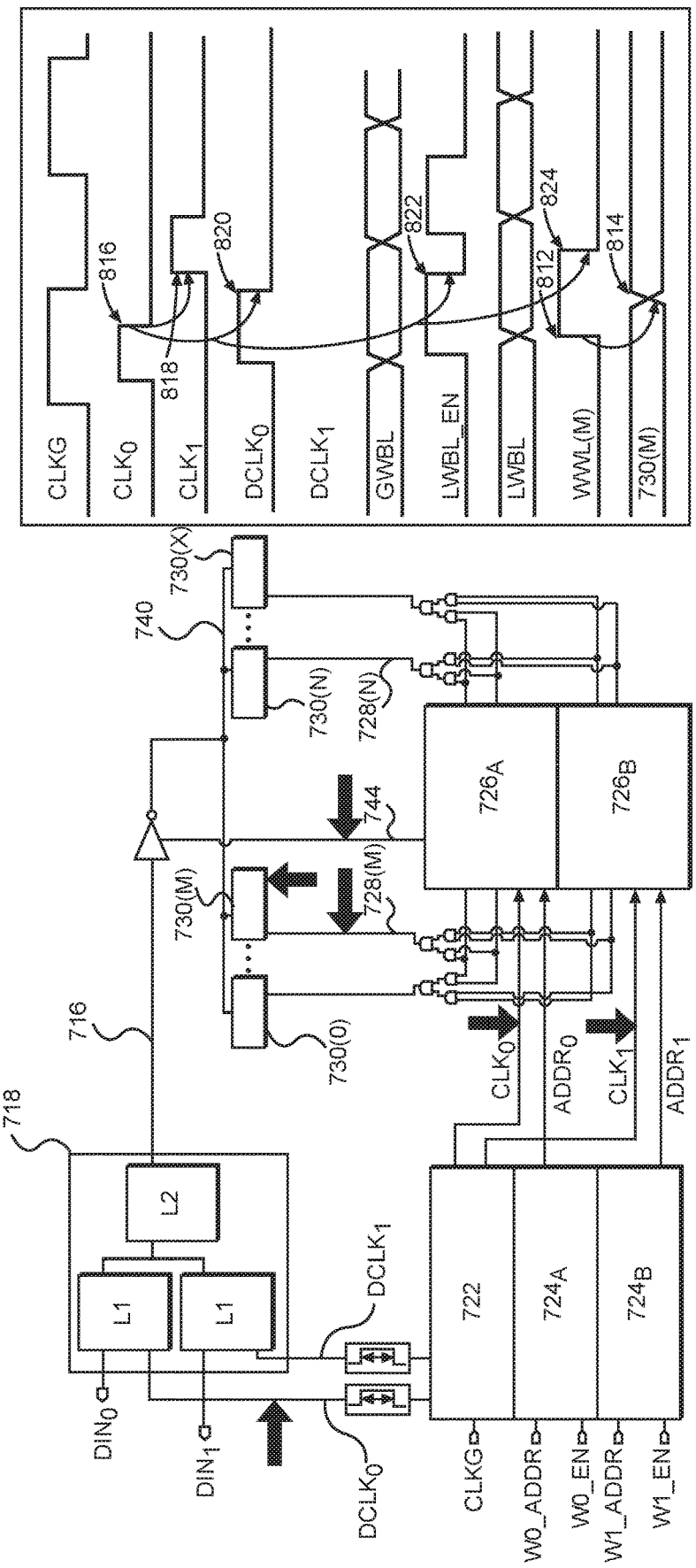
FIG. 8E is a diagram illustrating signal timing for a fifth stage of the double-pump memory array write circuit of FIG. 7 sequentially executing memory write requests received in parallel.

FIG. 8E illustrates a fifth exemplary stage showing the local write data value 746 being stored into the first memory bit cell 730(M) at 814 in response to activation of the first write word line 728(M). In addition, FIG. 8E shows, in response to a falling edge 816 of the first request clock signal CLK$_0$, activation of the second request clock signal CLK$_1$ at a rising edge 818, a falling edge 820 of the first data clock DCLK$_0$, deactivation of the local write bit line enable signal 744 at a falling edge 822, and deactivation of the first write word line 728(M) of the first memory bit cell 730(M) at a falling edge 824. The first memory write request 705$_A$ is completed and the second request clock signal CLK$_1$ is triggered at the end of the first request clock signal CLK$_0$.

Figure 8F:
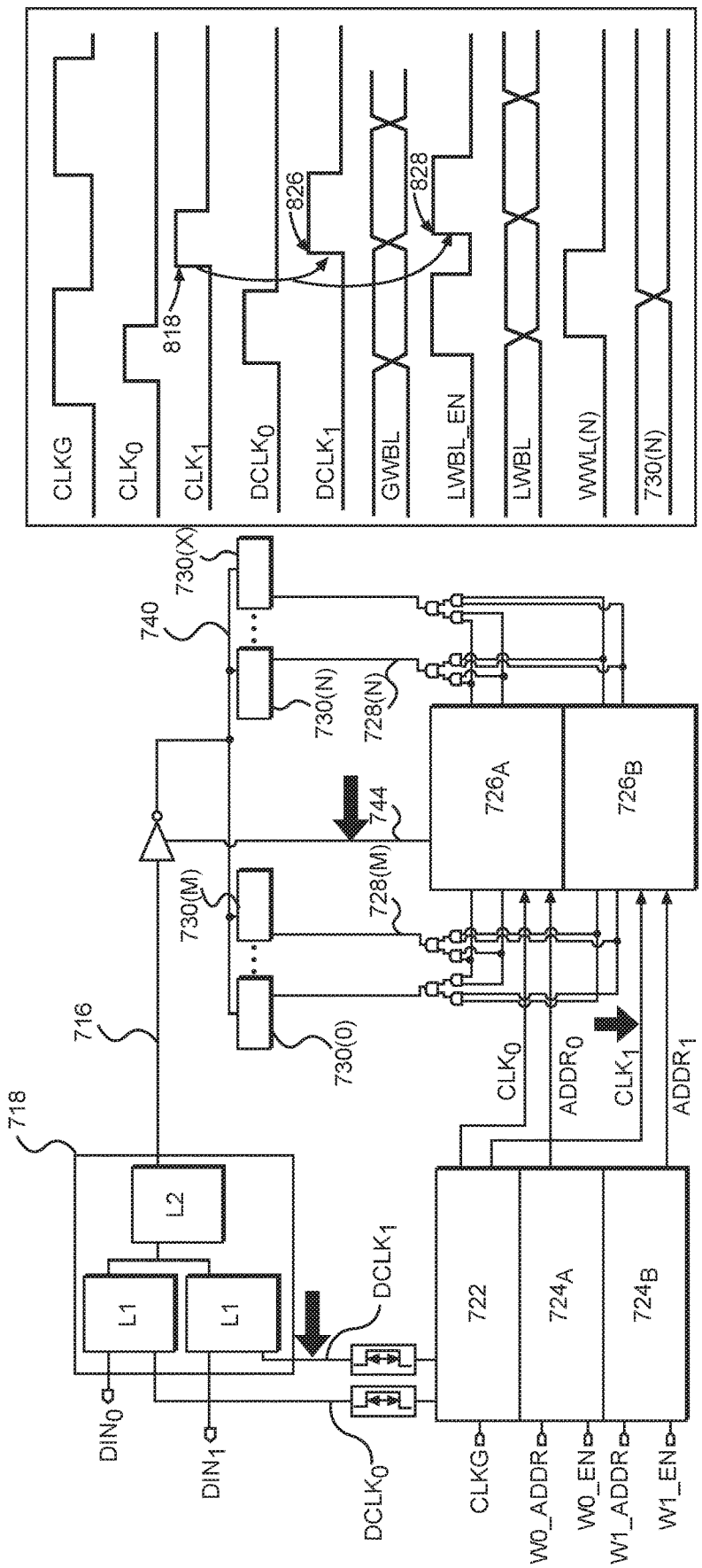
FIG. 8F is a diagram illustrating signal timing for a sixth stage of the double-pump memory array write circuit of FIG. 7 sequentially executing memory write requests received in parallel.

FIG. 8F illustrates a sixth exemplary stage showing, in response to the activation of the second request clock signal CLK$_1$ at the rising edge 818, activation of the second write data clock DCLK$_1$ at a rising edge 826, and activation of the local write bit line enable signal 744 at a rising edge 828 for the second memory write request 705$_B$. As a result, the coupling circuit 738 begins coupling the global write bit line 716 to the local write bit line 740 for the second memory write request 705$_B$.

Figure 8G:
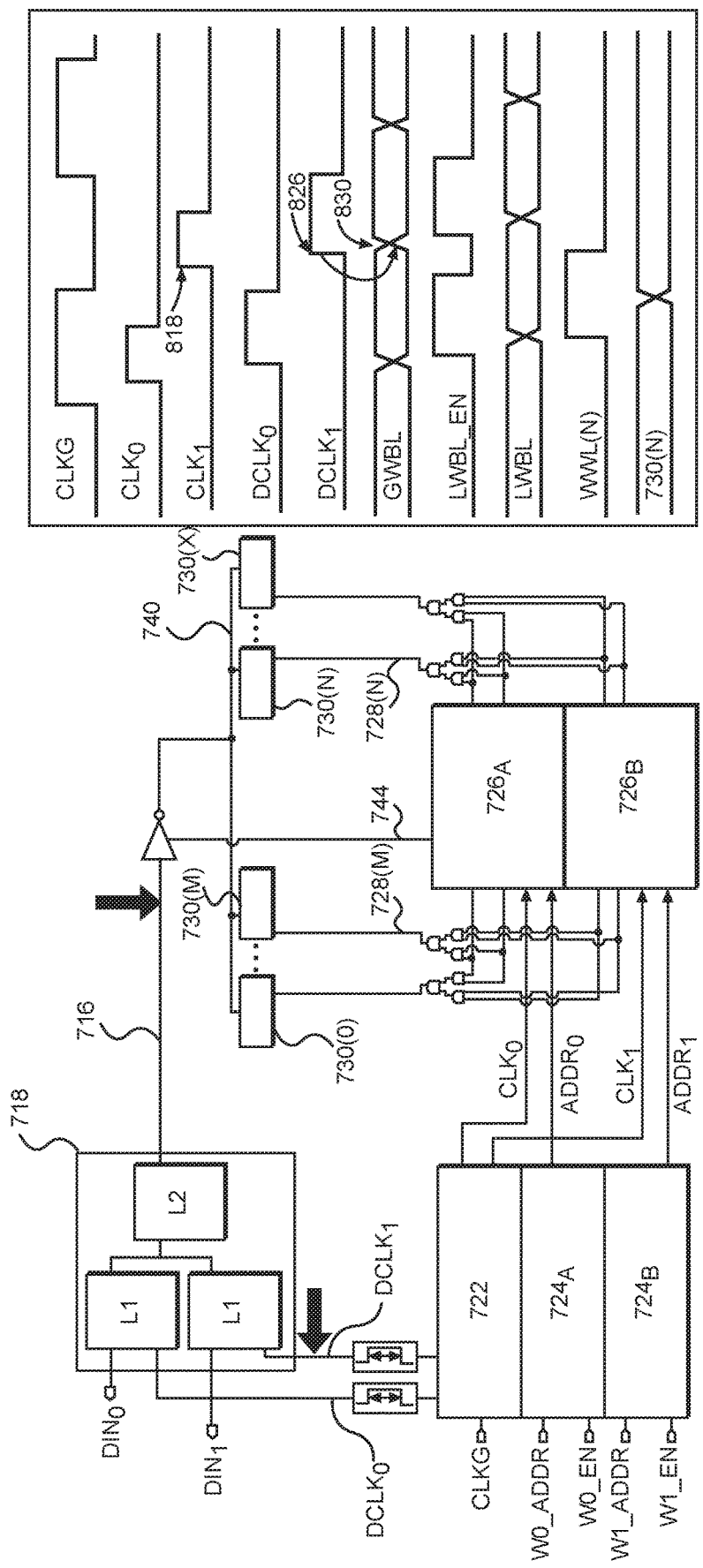
FIG. 8G is a diagram illustrating signal timing for a seventh stage of the double-pump memory array write circuit of FIG. 7 sequentially executing memory write requests received in parallel.

FIG. 8G illustrates a seventh exemplary stage showing, in response to the rising edge 826 activating the second write data clock DCLK$_1$, transferring the second write data 714$_B$ in the second staging latch 720$_B$ to the write data 734 on the data output 736 of the write latch 732 to set the global write data value 748 on the global write bit line 716 at transition 830. The latch circuit 718 makes it possible to transition from providing the first write data 714$_A$ to the global write bit line 716 to providing the second write data 714$_B$ to the global write bit line 716, without the including a multiplexer delay.

Figure 8H:
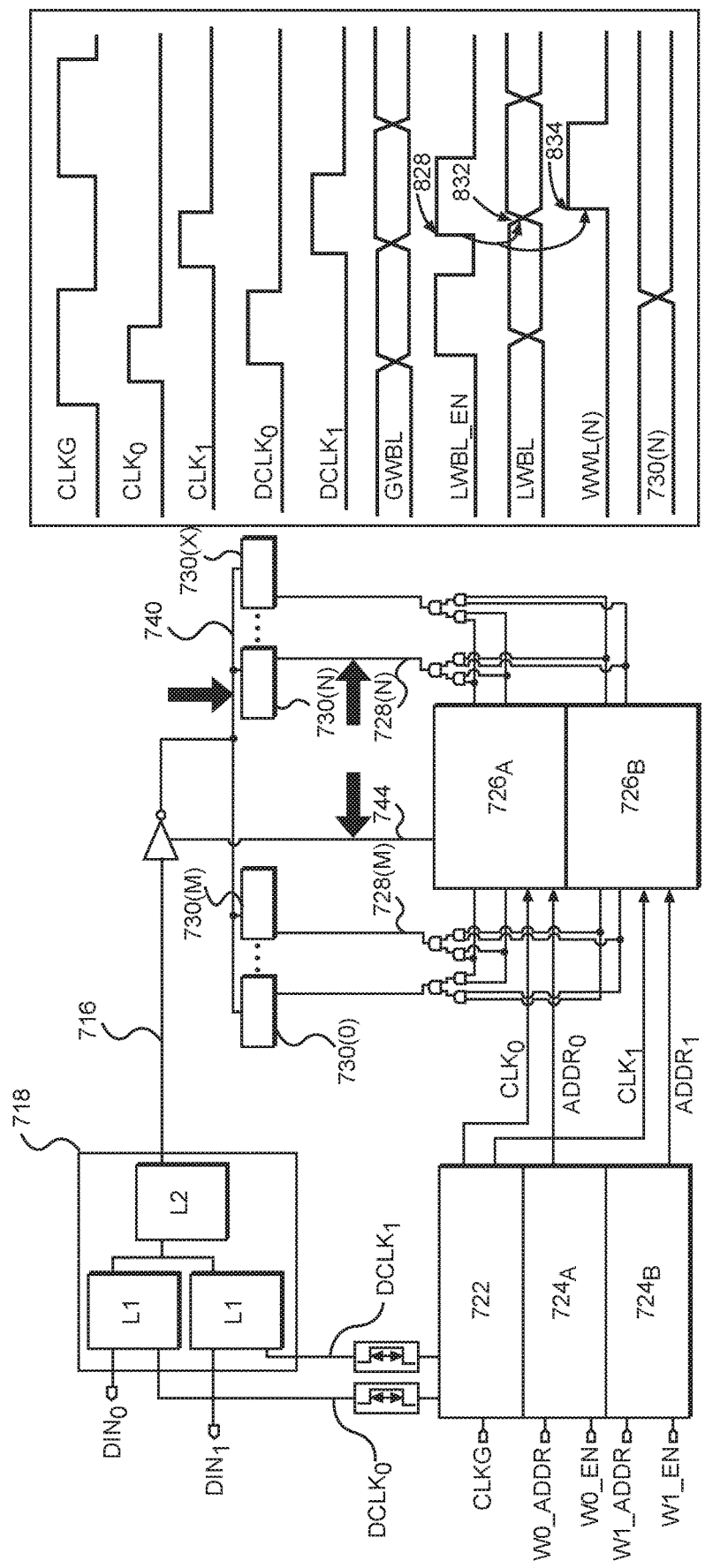
FIG. 8H is a diagram illustrating signal timing for an eighth stage of the double-pump memory array write circuit of FIG. 7 sequentially executing memory write requests received in parallel.

FIG. 8H illustrates an eighth exemplary stage showing, in response to a rising edge 828 activating the local write bit line enable signal 744, the local write data value 746 being set to the global write data value 748 at 832, and the second write word line 728(N) being activated by a rising edge 834. As the coupling circuit 738 is enabled, the local write data value 746 is set to the global write data value 748.

Figure 8I:
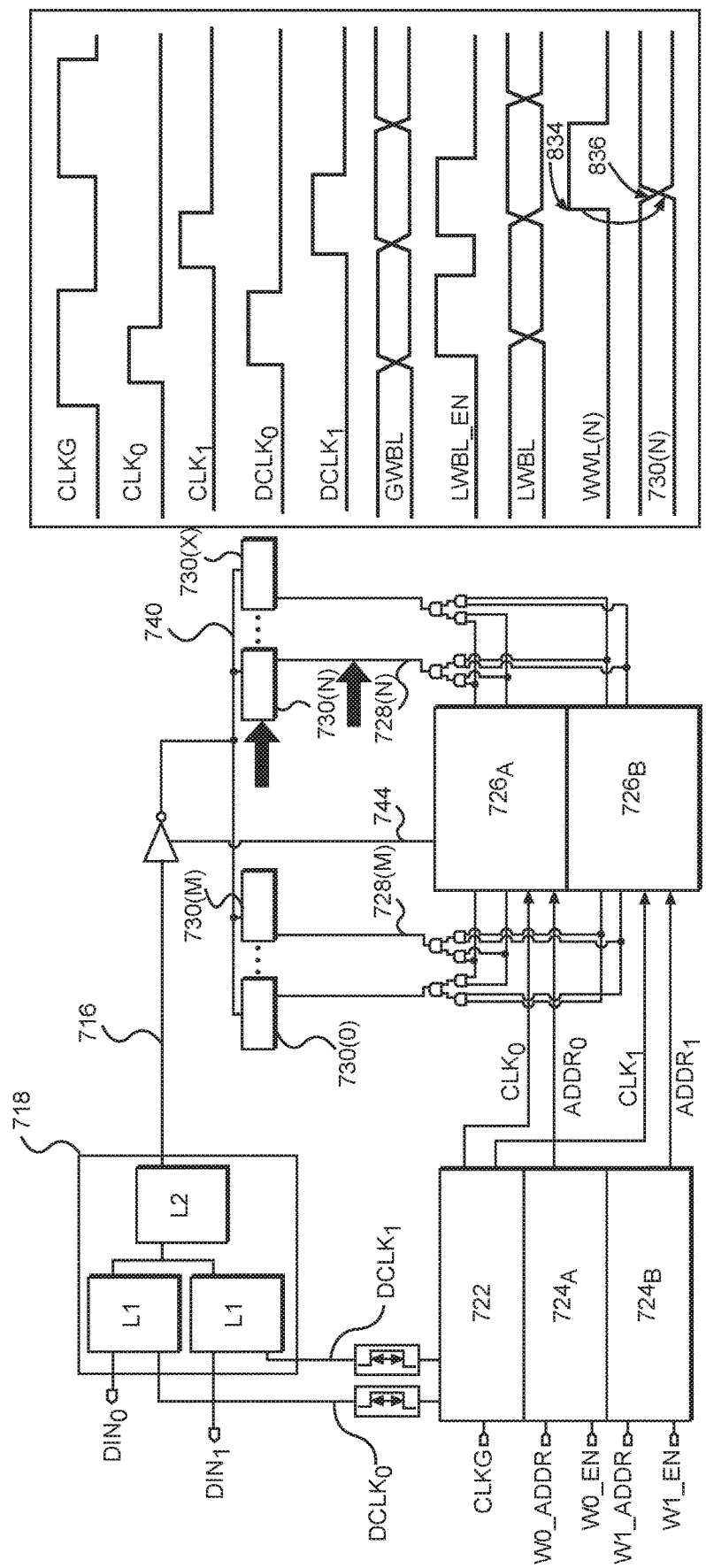
FIG. 8I is a diagram illustrating signal timing for a ninth stage of the double-pump memory array write circuit of FIG. 7 sequentially executing memory write requests received in parallel.

FIG. 8I illustrates a ninth exemplary stage showing the local write data value 746 being stored into the second memory bit cell 730(N) at 836 in response to activation of the second write word line 728(N) at the rising edge 834, completing the second memory write request 705$_B$.

Figure 8J:
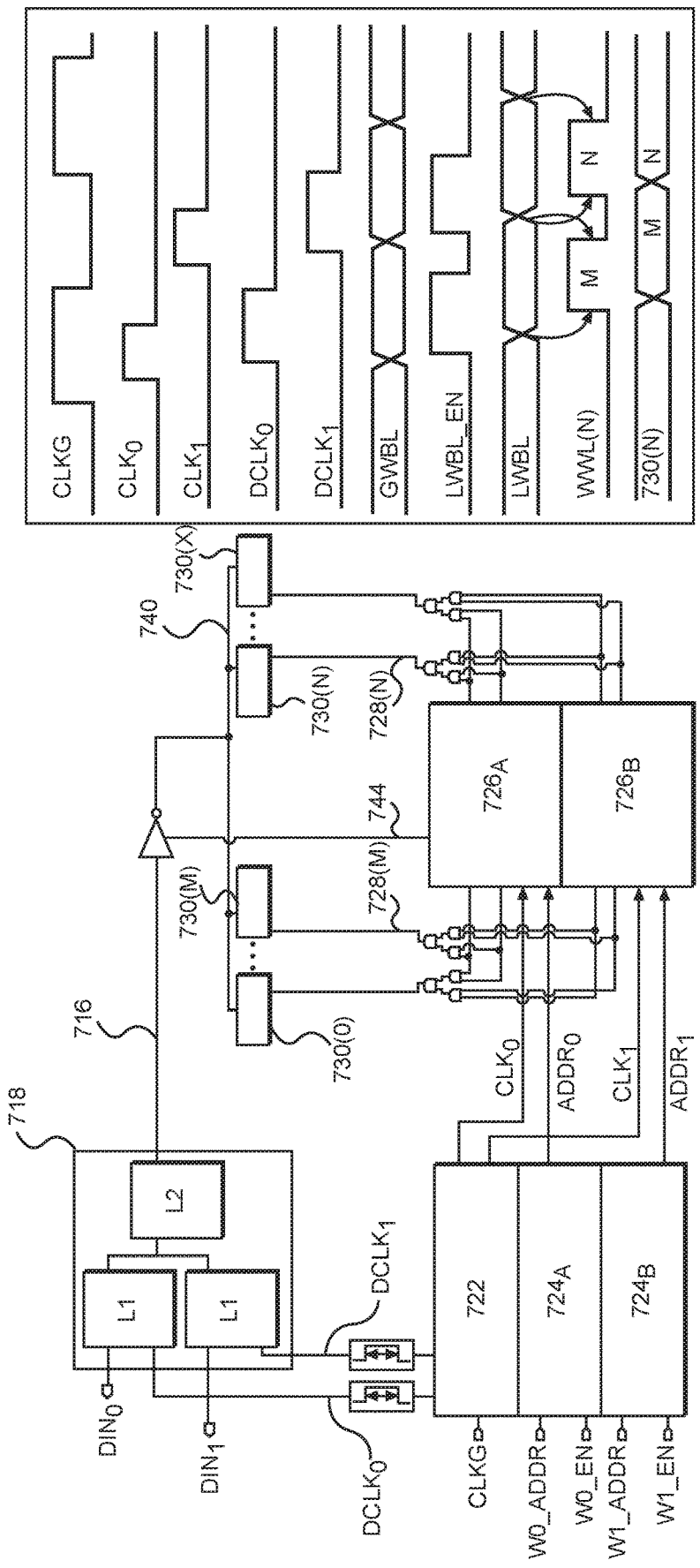
FIG. 8J is a diagram illustrating signal timing to show setup and hold times needed for writing data to a memory array in the double-pump memory array write circuit of FIG. 7.

FIG. 8J shows that the local write bit line 740 maintains required setup and hold times relative to the rising and falling edges of the write word lines 728(M) and 728(N).

Figure 9:
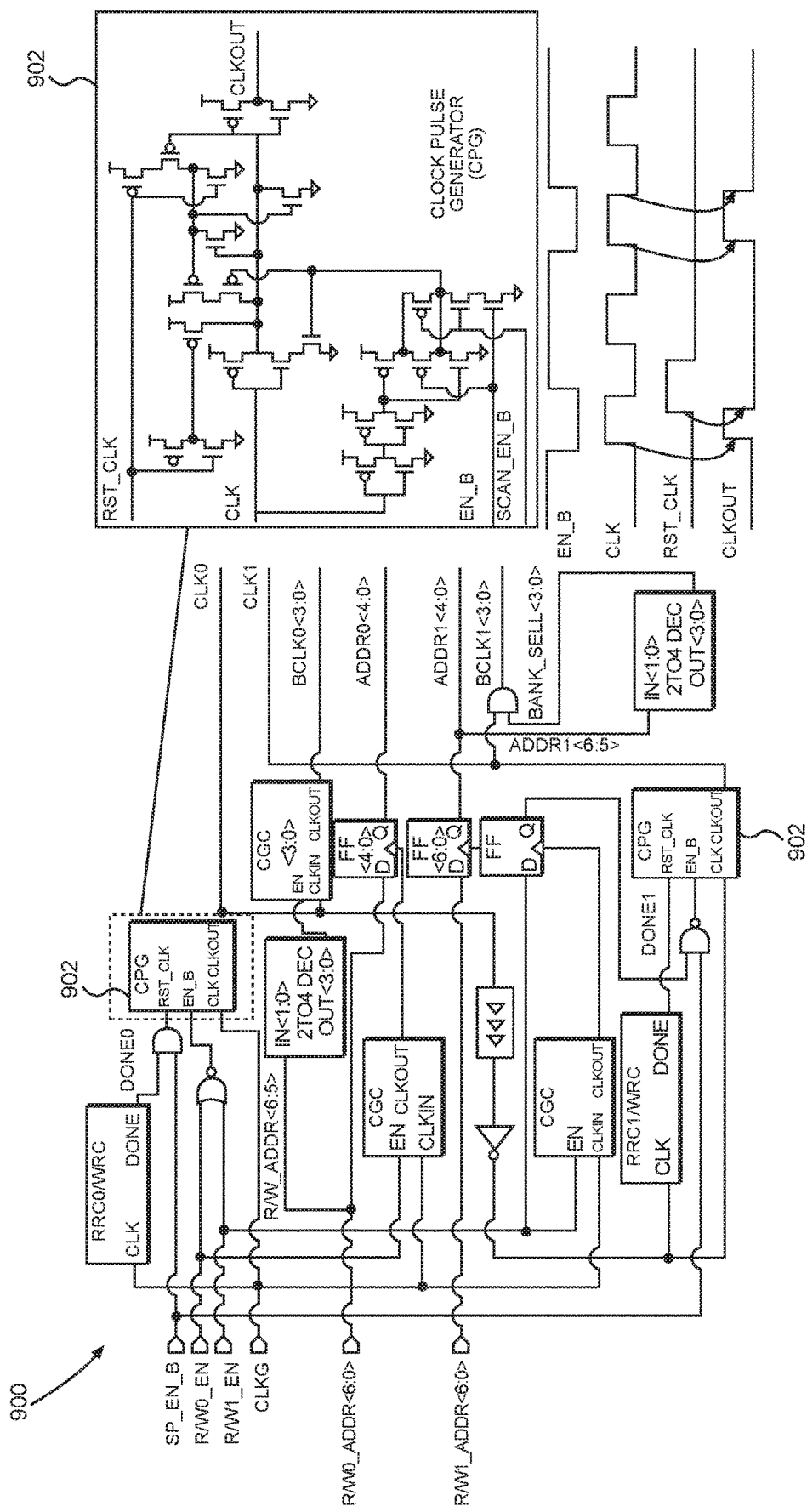
FIG. 9 is a schematic diagram illustrating a decoder control circuit employed in the double-pump memory array read circuit of FIG. 2 and the double-pump memory array write circuit of FIG. 7, a clock pulse generator circuit employed in the decoder control circuit, and a timing diagram illustrating operation of the clock pulse generator circuit for a double-pump memory access request and a single memory access request.

FIG. 9 is a schematic diagram illustrating details of a decoder control circuit 900 and a clock pulse generator circuit 902. The decoder control circuit 900 may be employed as the decoder control circuit 208 in the DP read circuit 200 of FIG. 2 and the decoder control circuit 708 in the DP write circuit 700 of FIG. 7. The decoder control circuit 900 is configured to control first and second memory access requests to a memory array in accordance with operations described herein. The clock pulse generator circuit 902 may be employed as the clock pulse generator circuit 220 in the decoder control circuit 208 and the clock pulse generator circuit 722 in the decoder control circuit 708. The decoder control circuit 900 includes two (2) instances of the clock pulse generator circuit 902. FIG. 9 also includes a timing diagram illustrating timing of functional inputs and an output of the clock pulse generator circuit 902. In the timing diagram, a "clkout" signal is activated for a short pulse followed by a long pulse. In the clock pulse generator circuit 220 in the DP read circuit 200, the short pulse is employed in a first request of first and second read requests received in parallel, as discussed above, because the intermediate value $V_{INT0}$ on the intermediate read bit line 236 coupled to the latch 218 takes less time to stabilize than when the intermediate read bit line 236 is coupled to the second global read bit line 214$_B$. The long clock pulse on clkout may be employed when no second read request is received in parallel with a first read request, and in a second read request if first and second read requests are received in parallel. The short duration of the first sequential read request makes it possible to execute two requests received in parallel on separate ports in less time than executing the two requests if received sequentially on a single port.

Figure 10:
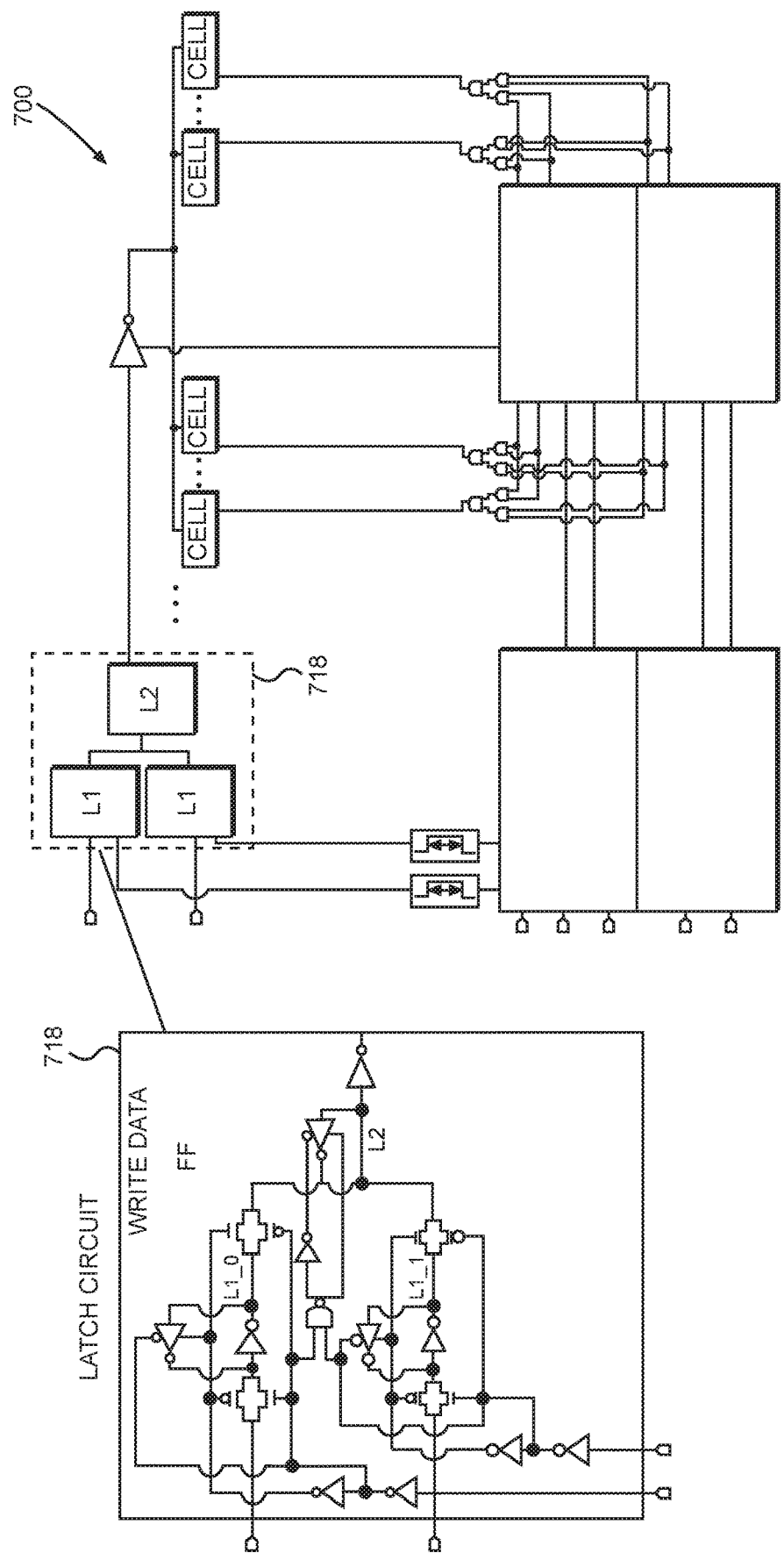
FIG. 10 is a schematic diagram of the double-pump memory array write circuit in FIG. 7 and a latch circuit employed therein to receive first and second data in parallel and sequentially transfer the first and second data to a global write bit line.

FIG. 10 is a schematic diagram of the DP write circuit 700 of FIG. 7 and a schematic diagram of the circuits included in the latch circuit 718. The latch circuit 718 makes it possible to execute sequential write operations in a single clock period without a multiplexer delay. The latch circuit 718 controls sequencing of the first and second write data $714_A$ and $714_B$ received in parallel onto the global write bit line 716 to the memory array 712. The latch circuit 718 eliminates the need for a multiplexer, reducing a propagation delay that affects the total time for each write operation.

The multi-pump memory system access circuits for sequentially executing parallel memory operations according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
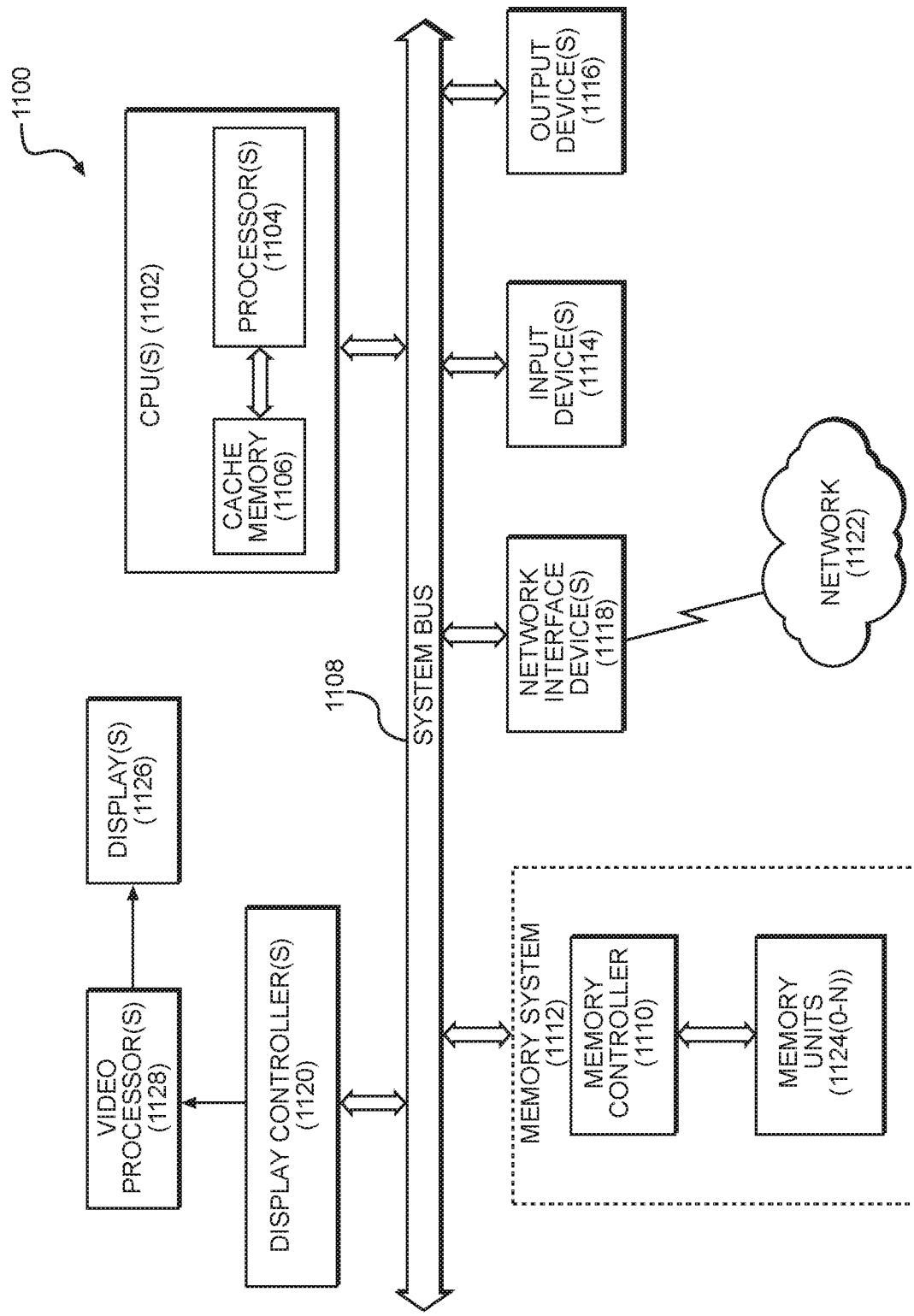
FIG. 11 is a block diagram of an exemplary processor-based system that can include multi-pump memory system access circuits for sequentially executing parallel memory operations, such as the double-pump memory array read circuit of FIG. 2 and the double-pump memory array write circuit of FIG. 7.

In this regard, FIG. 11 illustrates an example of a processor-based system 1100 that can employ multi-pump memory system access circuits for sequentially executing parallel memory operations, such as the DP read circuit 200 of FIG. 2 and the DP write circuit 700 of FIG. 7. In this example, the processor-based system 1100 includes one or more CPUs 1102, each including one or more processors 1104. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112 which may employ multi-pump memory system access circuits for sequentially executing parallel memory operations, such as the DP read circuit 200 of FIG. 2 and the DP write circuit 700 of FIG. 7. The memory system 1112 may also include one or more input devices 1114, one or more output devices 1116, one or more network interface devices 1118, and one or more display controllers 1120, as examples. The input device(s) 1114 can include any type of input device, including, but not limited to, input keys, switches, voice processors, etc. The output device(s) 1116 can include any type of output device, including, but not limited to, audio, video, other visual indicators, etc. The network interface device(s) 1118 can be any device configured to allow exchange of data to and from a network 1122. The network 1122 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1118 can be configured to support any type of communications protocol desired. The memory system 1112 can include one or more memory units 1124(0)-1124(N).

The CPU(s) 1102 may also he configured to access the display controller(s) 1120 over the system bus 1108 to control information sent to one or more displays 1126. The display controller(s) 1120 sends information to the display (s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display. etc.

Figure 12:
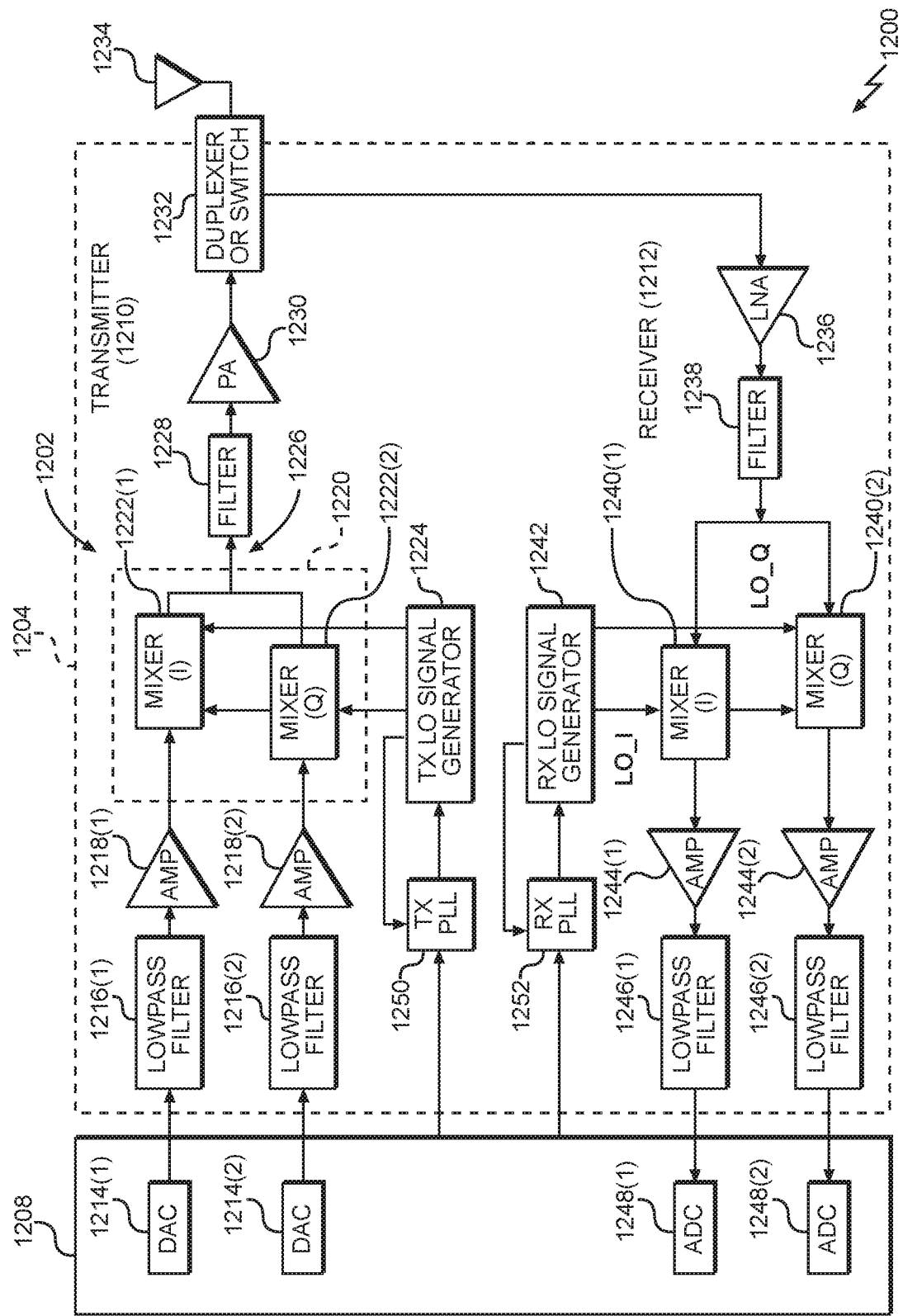
FIG. 12 is a block diagram of an exemplary wireless communications device that includes radio frequency (RF) components formed in an integrated circuit (IC), wherein clocked circuits in the wireless communications device can include multi-pump memory system access circuits for sequentially executing parallel memory operations, such as the double-pump memory array read circuit of FIG. 2 and the double-pump memory array write circuit of FIG. 7.

FIG. 12 illustrates an exemplary wireless communications device 1200 that includes radio frequency (RF) components formed in an integrated circuit (IC) 1202, wherein the IC 1202 can include multi-pump memory system access circuits for sequentially executing parallel memory operations, such as the DP read circuit 200 of FIG. 2 and the DP write circuit 700 of FIG. 7. In this regard, the wireless communications device 1200 may be provided in the IC 1202. As shown in FIG. 1 the wireless communications device 1200 includes a transceiver 1204 and a data processor 1208. The data processor 1208 may include a memory (not shown) with multi-pump memory system access circuits for sequentially executing parallel memory operations, such as the DP read circuit 200 of FIG. 2 and the DP write circuit 700 of FIG. 7, to store data and program codes. The transceiver 1204 includes a transmitter 1210 and a receiver 1212 that support bi-directional communications. In general, the wireless communications device 1200 may include any number of transmitters 1210 and/or receivers 1212 for any number of communications systems and frequency bands. All or a portion of the transceiver 1204 may be implemented on one or more analog ICs, RF ICs (RFICs), mixed-signal ICs, etc.

The transmitter 1210 or the receiver 1212 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1212. In the direct-conversion architecture, a signal is frequency-converted between RF and baseband in one stage. The super-heterodyne and direct-conversion architectures may use different circuit blocks and/or have different requirements. In the wireless communications device 1200 of FIG. 12, the transmitter 1210 and the receiver 1212 are implemented with the direct-conversion architecture.

In the transmit path, the data processor 1208 processes data to be transmitted and provides I and Q analog output signals to the transmitter 1210. In the exemplary wireless communications device 1200, the data processor 1208 includes digital-to-analog converters (DACs) 1214(1), 1214 (2) for converting digital signals generated by the data processor 1208 into the I and Q analog output signals, e.g., I and Q output currents, for further processing.

Within the transmitter 1210, lowpass filters 1216(1), 1216(2) filter the I and Q analog output signals, respectively, to remove undesired signals caused by the prior digital-to-analog conversion. Amplifiers (AMPs) 1218(1), 1218(2) amplify the signals from the lowpass filters 1216(1), 1216(2), respectively, and provide I and Q baseband signals. An upconverter 1220 upconverts the I and Q baseband signals with I and Q transmit (TX) local oscillator (LO) signals through mixers 1222(1), 1222(2) from a TX LO signal generator 1224 to provide an upconverted signal 1226. A filter 1228 filters the upconverted signal 1226 to remove undesired signals caused by the frequency upconversion as well as noise in a receive frequency band. A power amplifier (PA) 1230 amplifies the upconverted signal 1226 from the filter 1228 to obtain the desired delivered power level and provides a transmitted RF signal. The transmitted RF signal is routed through a duplexer or switch 1232 and transmitted via an antenna 1234.

In the receive path, the antenna 1234 receives signals transmitted by base stations and provides a received RF signal, which is routed through the duplexer or switch 1232 and provided to a low noise amplifier (LNA) 1236. The duplexer or switch 1232 is designed to operate with a specific receive (RX)-to-TX duplexer frequency separation, such that RX signals are isolated from TX signals. The received RF signal is amplified by the LNA 1236 and filtered by a filter 1238 to obtain a desired RF input signal. Downconversion mixers 1240(1), 1240(2) mix the output of the filter 1238 with and Q RX LO signals (i.e., LO_I and LO_Q) from an RX LO signal generator 1242 to generate I and Q baseband signals. The I and Q baseband signals are amplified by amplifiers (AMPs) 1244(1), 1244(2) and further filtered by lowpass filters 1246(1), 1246(2) to obtain I and Q analog input signals, which are provided to the data processor 1208. In this example, the data processor 1208 includes analog-to-digital converters (ADCs) 1248(1), 1248(2) for converting the analog input signals into digital signals to be further processed by the data processor 1208.

In the wireless communications device 1200 of FIG. 12, the TX LO signal generator 1224 generates the I and Q TX LO signals used for frequency upconversion, while the RX LO signal generator 1242 generates the I and Q RX LO signals used for frequency downconversion. Each LO signal is a periodic signal with a particular fundamental frequency. A TX phase-locked-loop (PLL) circuit 1250 receives timing information from the data processor 1208 and generates a control signal used to adjust the frequency and/or phase of the TX LO signals from the TX LO signal generator 1224. Similarly, an RX PLL circuit 1252 receives timing information from the data processor 1208 and generates a control signal used to adjust the frequency and/or phase of the RX LO signals from the RX LO signal generator 1242.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may he subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A double-pump read circuit, comprising:
a decoder control circuit configured to receive a first memory read request in parallel with a second memory read request, the decoder control circuit comprising:
a first decoder circuit configured to generate a first decoded read address corresponding to the first memory read request; and
a second decoder circuit configured to generate a second decoded read address corresponding to the second memory read request;
an array control circuit configured to:
activate a first read word line corresponding to the first decoded read address corresponding to a first memory bit cell among a plurality of memory bit cells in a memory array; and
activate a second read word line corresponding to the second decoded read address corresponding to a second memory bit cell among the plurality of memory bit cells in the memory array;
a read bit line circuit configured to:
responsive to the first read word line being activated, set a local read bit line to a first data value of first data stored in the first memory bit cell corresponding to the first decoded read address, and set an intermediate value on an intermediate read bit line according to the first data value; and
responsive to the second read word line being activated, set the local read bit line to a second data value of second data stored in the second memory bit cell corresponding to the second decoded read address, and set the intermediate value on the intermediate read bit line according to the second data value;
a latch configured to store the intermediate value on the intermediate read bit line; and
an evaluation circuit configured to:
couple a data output of the latch to a first global read bit line to set a first read data value of the first global read bit line to the stored intermediate value;
evaluate the first global read bit line;
couple the intermediate read bit line to a second global read bit line to set a second read data value of the second global read bit line to the intermediate value; and
evaluate the second global read bit line.

2. The double-pump read circuit of claim 1, further comprising:
a clock pulse generator circuit configured to receive a global clock signal having a clock period; and
the decoder control circuit further configured to generate the first decoded read address and the second decoded read address in the clock period of the global clock signal.

3. The double-pump read circuit of claim 2, wherein:
the evaluation circuit is further configured to evaluate the first read data value and the second read data value in the clock period.

4. The double-pump read circuit of claim 2, wherein:
the clock pulse generator circuit is configured to generate, in response to the global clock signal, a first request clock signal and a second request clock signal in the clock period; and
the array control circuit is further configured to activate the first read word line in response to the first request clock signal, and activate the second read word line in response to the second request clock signal.

5. The double-pump read circuit of claim 4, wherein the latch is further configured to store the intermediate value in response to the first request clock signal.

6. The double-pump read circuit of claim 2, wherein:
the clock pulse generator circuit is further configured to generate, in response to the global clock signal, a first evaluate clock signal and a second evaluate clock signal in the clock period; and
the evaluation circuit is further configured to evaluate the first read data value on the first global read bit line in response to the first evaluate clock signal, and evaluate the second read data value on the second global read bit line in response to the second evaluate clock signal.

7. The double-pump read circuit of claim 4, wherein:
the first request clock signal comprises a first clock pulse having a first rising edge and a first falling edge, and the second request clock signal comprises a second clock pulse having a second rising edge and a second falling edge; and
the clock pulse generator circuit is further configured to generate the second rising edge of the second request clock signal in response to the first falling edge of the first request clock signal.

8. The double-pump read circuit of claim 7, wherein:
the read bit line circuit is further configured to precharge the local read bit line for the first memory read request;
responsive to the first rising edge of the first clock pulse, the read bit line circuit is further configured to discontinue precharging the local read bit line;
responsive to the first clock pulse, the latch is further configured to store the intermediate value; and
responsive to the first falling edge of the first clock pulse, the read bit line circuit is further configured to precharge the local read bit line for the second memory read request.

9. The double-pump read circuit of claim 1, wherein the first decoded read address is the same as the second decoded read address.

10. A method of double-pumping read requests in a memory system, comprising:
receiving a first memory read request in parallel with a second memory read request;
generating a first decoded read address corresponding to the first memory read request;
generating a second decoded read address corresponding to the second memory read request;
activating a first read word line corresponding to the first decoded read address corresponding to a first memory bit cell among a plurality of memory bit cells in a memory array;
activating a second read word line responding to the second decoded read address corresponding to a second memory bit cell among the plurality of memory bit cells in the memory array;
responsive to the first read word line being activated, setting a local read bit line to a first data value of first data stored in the first memory bit cell corresponding to the first decoded read address, and setting an intermediate value on an intermediate read bit line according to the first data value;
responsive to the second read word line being activated, setting the local read bit line to a second data value of second data stored in the second memory bit cell corresponding to the second decoded read address, and setting the intermediate value on the intermediate read bit line according to the second data value;

storing the intermediate value on the intermediate read bit line in a latch;

coupling a data output of the latch to a first global read bit line to set a first read data value of the first global read bit line to the stored intermediate value;

evaluating the first read data value on the first global read bit line;

coupling the intermediate read bit line to a second global read bit line to set a second read data value of the second global read bit line to the intermediate value; and evaluating the second read data value on the second global read bit line.

11. The method of claim 10, further comprising:
receiving a global clock signal having a clock period; and
generating the first decoded read address and the second decoded read address in the clock period of the global clock signal.

12. The method of claim 11, further comprising:
evaluating the first read data value and the second read data value in an evaluation circuit in the clock period.

13. The method of claim 11, further comprising:
generating, in response to the global clock signal, a first request clock signal and a second request clock signal in the clock period;
activating the first read word line in response to the first request clock signal; and
activating the second read word line in response to the second request clock signal.

14. The method of claim 13, further comprising storing the intermediate value in response to the first request clock signal.

15. The method of claim 11, further comprising:
generating, in response to the global clock signal, a first evaluate clock signal and a second evaluate clock signal in the clock period;
evaluating the first read data value on the first global read bit line in response to the first evaluate clock signal; and
evaluating the second read data value on the second global read bit line in response to the second evaluate clock signal.

16. The method of claim 13, wherein:
generating the first request clock signal comprises generating a first clock pulse having a first rising edge and a first falling edge;
generating the second request clock signal comprises generating a second clock pulse having a second rising edge and a second falling edge; and
the method further comprises:
generating the second rising edge of the second request clock signal in response to the first falling edge of the first request clock signal.

17. The method of claim 16, further comprising:
precharging the local read bit line for the first memory read request;
responsive to the first rising edge of the first clock pulse, stopping precharging the local read bit line;
responsive to the first clock pulse, storing the intermediate value in the latch; and
responsive to the first falling edge of the first clock pulse, precharging the local read bit line for the second memory read request.

18. A double-pump write circuit, comprising:
a decoder control circuit configured to receive a first memory write request in parallel with a second memory write request, the decoder control circuit comprising:
a first decoder circuit configured to generate a first decoded write address corresponding to the first memory write request; and
a second decoder circuit configured to generate a second decoded write address corresponding to the second memory write request;
an array control circuit configured to:
activate a first write word line corresponding to the first decoded write address corresponding to a first memory bit cell among a plurality of memory bit cells in a memory array; and
activate a second write word line corresponding to the second decoded write address corresponding to a second memory bit cell among the plurality of memory bit cells in the memory array;
a latch circuit comprising a first staging latch, a second staging latch, and a write latch, the latch circuit configured to:
receive, in parallel, first write data corresponding to the first memory write request at the first staging latch, and second write data corresponding to the second memory write request at the second staging latch; and
sequentially transfer the first write data of the first staging latch to the write latch, and transfer the second write data of the second staging latch to the write latch;
a global write bit line coupled to a data output of the write latch, to set a global write data value to a write data value of the data output of the write latch; and
a local write bit line circuit configured to:
couple the global write bit line to a local write bit line to set a local write data value on the local write bit line to the global write data value on the global write bit line;
responsive to the first write word line being activated, store the local write data value of the local write bit line in the first memory bit cell; and
responsive to the second write word line being activated, store the local write data value of the local write bit line in the second memory bit cell.

19. The double-pump write circuit of claim 18, further comprising:
a clock pulse generator circuit configured to receive a global clock signal having a clock period; and
the decoder control circuit further configured to generate the first decoded write address and the second decoded write address in the clock period of the clock signal.

20. The double-pump write circuit of claim 19, wherein:
the clock pulse generator circuit is configured to generate, in response to the global clock signal, a first request clock signal and a second request clock signal in the clock period; and
the array control circuit is further configured to activate the first write word line in response to the first request clock signal, and activate the second write word line in response to the second request clock signal.

21. The double-pump write circuit of claim 20, wherein the latch circuit is further configured to:
responsive to the first request clock signal, transfer the first write data of the first staging latch to the write latch; and
responsive to the second request clock signal, transfer the second write data of the second staging latch to the write latch.

22. The double-pump write circuit of claim 20, wherein the local write bit line circuit is further configured to couple the global write bit line to the local write bit line responsive to the first request clock signal and responsive to the second request clock signal.

23. A method of double-pumping write requests in a memory system, comprising:
   receiving a first memory write request in parallel with a second memory write request;
   generating a first decoded write address corresponding to the first memory write request;
   generating a second decoded write address corresponding to the second memory write request;
   activating a first write word line corresponding to the first decoded write address corresponding to a first memory bit cell among a plurality of memory bit cells in a memory array;
   activating a second write word line corresponding to the second decoded write address corresponding to a second memory bit cell among the plurality of memory bit cells in the memory array;
   receiving, in parallel, first write data corresponding to the first memory write request at a first staging latch, and second write data corresponding to the second memory write request at a second staging latch;
   sequentially transferring the first write data of the first staging latch to a write latch, and transferring the second write data of the second staging latch to the write latch;
   coupling a data output of the write latch to a global write bit line, the global write bit line having a line value corresponding to a data value of data in the write latch;
   coupling the global write bit line to a local write bit line;
   responsive to the first write word line being activated, storing the line value of the local write bit line in the first memory bit cell; and
   responsive to the second write word line being activated, storing the line value of the local write bit line in the second memory bit cell.

24. The method of claim 23, further comprising:
receiving a global clock signal having a clock period; and
generating the first decoded write address and the second decoded write address in the clock period.

25. The method of claim 24, further comprising:
generating, in response to the global clock signal, a first request clock signal and a second request clock signal in the clock period;
activating the first write word line in response to the first request clock signal; and
activating the second write word line in response to the second request clock signal.

26. The method of claim 25, further comprising:
responsive to the first request clock signal, transferring the first write data of the first staging latch to the write latch; and
responsive to the second request clock signal, transferring the second write data of the second staging latch to the write latch.

27. The method of claim 25, further comprising:
coupling the global write bit line to the local write bit line responsive to the first request clock signal and responsive to the second request clock signal.

* * * * *